United States Patent
Graves et al.

(10) Patent No.: US 9,231,584 B2
(45) Date of Patent: Jan. 5, 2016

(54) DEVICE AND METHOD FOR MICRO-ELECTRO-MECHANICAL-SYSTEM PHOTONIC SWITCH

(71) Applicant: Huawei Technologies Co., Ltd., Shenzhen (CN)

(72) Inventors: Alan Frank Graves, Kanata (CA); Dominic Goodwill, Ottawa (CA)

(73) Assignee: Huawei Technologies Co., LTD., Shenzhen (CN)

( * ) Notice: Subject to any disclaimer, the term of this patent is extended or adjusted under 35 U.S.C. 154(b) by 65 days.

(21) Appl. No.: 13/964,437

(22) Filed: Aug. 12, 2013

(65) Prior Publication Data
US 2015/0041629 A1    Feb. 12, 2015

(51) Int. Cl.
| | |
|---|---|
| G02B 6/26 | (2006.01) |
| H03K 17/78 | (2006.01) |
| G02B 6/35 | (2006.01) |
| G02B 27/62 | (2006.01) |
| G02B 26/08 | (2006.01) |
| H01H 1/00 | (2006.01) |

(52) U.S. Cl.
CPC .............. *H03K 17/78* (2013.01); *G02B 6/3518* (2013.01); *G02B 6/3556* (2013.01); *G02B 6/3588* (2013.01); *G02B 26/0841* (2013.01); *G02B 27/62* (2013.01); *H01H 1/0036* (2013.01)

(58) Field of Classification Search
CPC ...... H03K 17/78; G02B 6/359; G02B 6/3518; G01B 11/272

USPC .......................................................... 385/17
See application file for complete search history.

(56) References Cited

U.S. PATENT DOCUMENTS

| | | | |
|---|---|---|---|
| 6,591,029 | B1 | 7/2003 | Lin et al. |
| 6,760,505 | B1 | 7/2004 | Street et al. |
| 2005/0031251 | A1* | 2/2005 | Schroeder ........................ 385/16 |
| 2005/0117838 | A1 | 6/2005 | Okada et al. |
| 2008/0031569 | A1* | 2/2008 | Bruns ................................ 385/18 |

FOREIGN PATENT DOCUMENTS

| | | |
|---|---|---|
| CN | 1497283 A | 5/2004 |
| CN | 101718908 A | 6/2010 |
| CN | 102590953 A | 7/2012 |
| JP | 2011028235 A | 2/2011 |

OTHER PUBLICATIONS

"S320 Photonic Switch," Calient Technologies Datasheet, www.calient.net, downloaded Aug. 19, 2013, 2 pgs.
Aksyuk, V.A., et al., "238 x 238 Micromechanical Optical Cross Connect," IEEE Photonics Technology Letters, vol. 15, No. 4, Apr. 2003, pp. 587-589.

(Continued)

Primary Examiner — Thanh Luu
(74) Attorney, Agent, or Firm — Slater & Matsil, L.L.P.

(57) ABSTRACT

In one embodiment, a micro-electro-mechanical-system (MEMS) photonic switch includes a first plurality of collimators and a first mirror array optically coupled to the first plurality of collimators. The first mirror array includes a first plurality of first MEMS mirrors integrated on a first substrate and a first plurality of first photodiodes integrated on the first substrate, where the photodiodes are disposed in interstitial spaces between the MEMS mirrors.

30 Claims, 18 Drawing Sheets

(56) References Cited

OTHER PUBLICATIONS

Chu, P.B., et al., "Design and Nonlinear Servo Control of MEMS Mirrors and Their Performance in a Large Port-count Optical Switch," Submitted to IEEE Journal of Microelectromechanical Systems, Dec. 2003 (Revised Apr. 2004), 9 pgs.

Kawajiri, Y., et al., "512 x 512 Port 3D MEMS Optical Switch Module with Toroidal Concave Mirror," NTT Technical Review, Regular Articles, vol. 10, No. 11, Nov. 2012, 7 pgs.

Kim, J., et al., "1100 x 1100 Port MEMS-Based Optical Crossconnect With 4-dB Maximum Loss," IEEE Photonics Technology Letters, vol. 15, No. 11, Nov. 2003, pp. 1537-1539.

Wu, M., "Optical MEMS for Telecommunication Systems," University of California, Berkeley, Department of EECS & BSAC, Mar. 14, 2006, 41 pgs.

International Search Report of Patent Coorperation Treaty (PCT), International Application No. PCT/CN2014/084149, Applicant Huawei Technologies Co., Ltd., date of mailing Nov. 18, 2014, 11 pages.

* cited by examiner

DEVICE AND METHOD FOR MICRO-ELECTRO-MECHANICAL-SYSTEM PHOTONIC SWITCH

TECHNICAL FIELD

The present invention relates to photonics, and, in particular, to a device and method for a micro-electro-mechanical-system (MEMS) photonic switch.

BACKGROUND

A type of photonic switch is a three dimensional (3D) micro-electro-mechanical-system (MEMS) photonic switch. MEMS photonic switches have excellent properties, such as the ability to achieve a high port count. Also, MEMS photonic switches have excellent optical properties, such as low loss, low polarization dependence, high linearity, and low noise. Additionally, MEMS photonic switches have excellent off-state properties, such as high isolation and low crosstalk.

However, MEMS photonic switches have some issues that limit their widespread use, such as slow switching speeds, driven by the complex methods of control. This is especially problematic when MEMS photonic switches are used in a cascade configuration, such as in a three stage CLOS switch, or to set up a path transiting multiple nodes across a photonic switched network. Also, control methods may leave residual modulation introduced by the switch, which can interfere with the cascading of the switch.

SUMMARY

An embodiment micro-electro-mechanical-system (MEMS) photonic switch includes a first plurality of collimators and a first mirror array optically coupled to the first plurality of collimators. The first mirror array includes a first plurality of first MEMS mirrors integrated on a first substrate and a first plurality of first photodiodes integrated on the first substrate, where the photodiodes are disposed in interstitial spaces between the MEMS mirrors.

An embodiment method of aligning a first mirror and a second mirror of a micro-electro-mechanical system (MEMS) photonic switch includes receiving, by a first collimator of a first plurality of collimators, a first optical control signal and reflecting, by the first mirror on a first mirror array, the first optical control signal to produce a first optical control beam. The method also includes detecting, by a first photodiode having a first location on a second mirror array, a first beam spot of the first optical control beam to produce a first detected optical signal, where the second mirror array includes the second mirror.

An embodiment control system includes a mirror acquisition control unit configured to be coupled to a micro-electromechanical-system (MEMS) photonic switch, where the mirror acquisition control unit is configured to receive a first plurality of signals from a first plurality of interstitial photodiodes having a first plurality of locations on a first MEMS mirror array of the MEMS photonic switch and a mirror driver coupled to the mirror acquisition control unit, where the mirror driver is configured to be coupled to the MEMS photonic switch, and where the mirror driver is configured to control a first mirror of a second MEMS mirror array of the MEMS photonic switch in accordance with the first plurality of signals and the first plurality of locations.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In an embodiment, photodiodes are interstitially placed on a micro-electro-mechanical-system (MEMS) substrate between mirrors in a MEMS photonic switch. The photodiodes are used during the set up phase to align mirrors by detecting the initial beam landing spots on the opposite substrate with a high degree of precision, allowing direct computation of a vector to the correct pointing. A dithering technique may be used for additional alignment of the mirrors. An optical beam at a control wavelength propagates in both directions through the photonic switch, illuminating only the photodiodes on the opposing substrate. Thus, opposing two mirrors may be independently and simultaneously aligned.

A three-dimensional (3D) MEMS photonic switch may use one or two arrays of steerable mirrors to form switchable optical paths between collimator arrays. When one mirror array is used, the mirror array is arranged opposite a static planar or near planar retro-reflective mirror. In this example, the control wavelength propagates in both directions through the photonic switch, illuminating only the photodiodes around the second mirror encountered on each control carrier's path.

Figure 1:
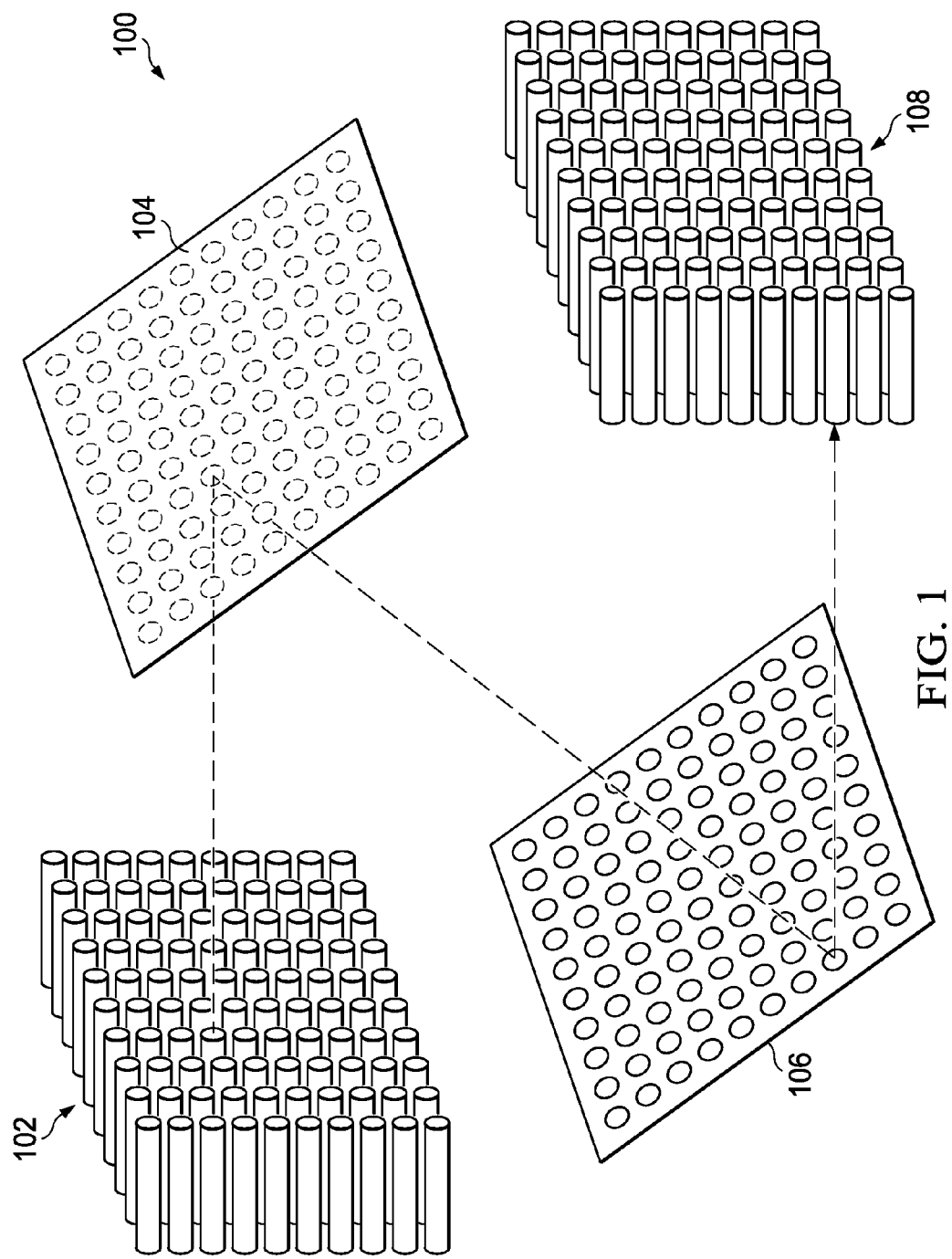
FIG. 1 illustrates an embodiment micro-electro-mechanical-system (MEMS) photonic switch.

FIG. 1 illustrates MEMS photonic switch 100, a three dimensional (3D) MEMS photonic switch with two arrays of steerable mirrors. MEMS photonic switch 100 contains mirror arrays 104 and 106. Light enters via collimator array 102, for example from optical fibers, and impinges on mirrors of mirror array 104. Mirrors of mirror array 104 are adjusted in angle in two planes to cause the light to impinge on the appropriate mirrors of mirror array 106. The mirrors of mirror array 106 are associated with particular output ports of collimator array 108. Also, mirrors of mirror array 106 are adjusted in angle in two planes to cause coupling to the appropriate output port. The light then exits in a collimator of collimator array 108, for example coupling to optical fibers. Similarly, light enters collimator array 108, reflects off mirrors of mirror array 106, reflects off mirrors of mirror array 104, and exits through collimator array 102.

The mirror arrays have arrays of steerable 3D-MEMS mirrors (referred to here as MEMS mirrors) which reflect a beam projected onto them by an associated collimator. The reflected beam is then reflected on an opposing mirror on the opposing mirror array. Thus, an N×N MEMS photonic switching module contains N input mirrors, each of which can access any of N mirrors on the opposing mirror array, and vice versa. This enables the mirror count to grow linearly with the port count of the switch, utilizing 2N steerable mirrors for an N×N switch. For many other methods of building photonic switches, the mirror count or crosspoint count grows as with the square of the port count. Thus, MEMS photonic switches are able to scale to a large port count, while some other approaches are limited by mirror count or crosspoint count. However, as the port count grows in a MEMS photonic switch, the optical path length between the mirrors and/or the maximum mirror deflection angle increases.

Figure 2:
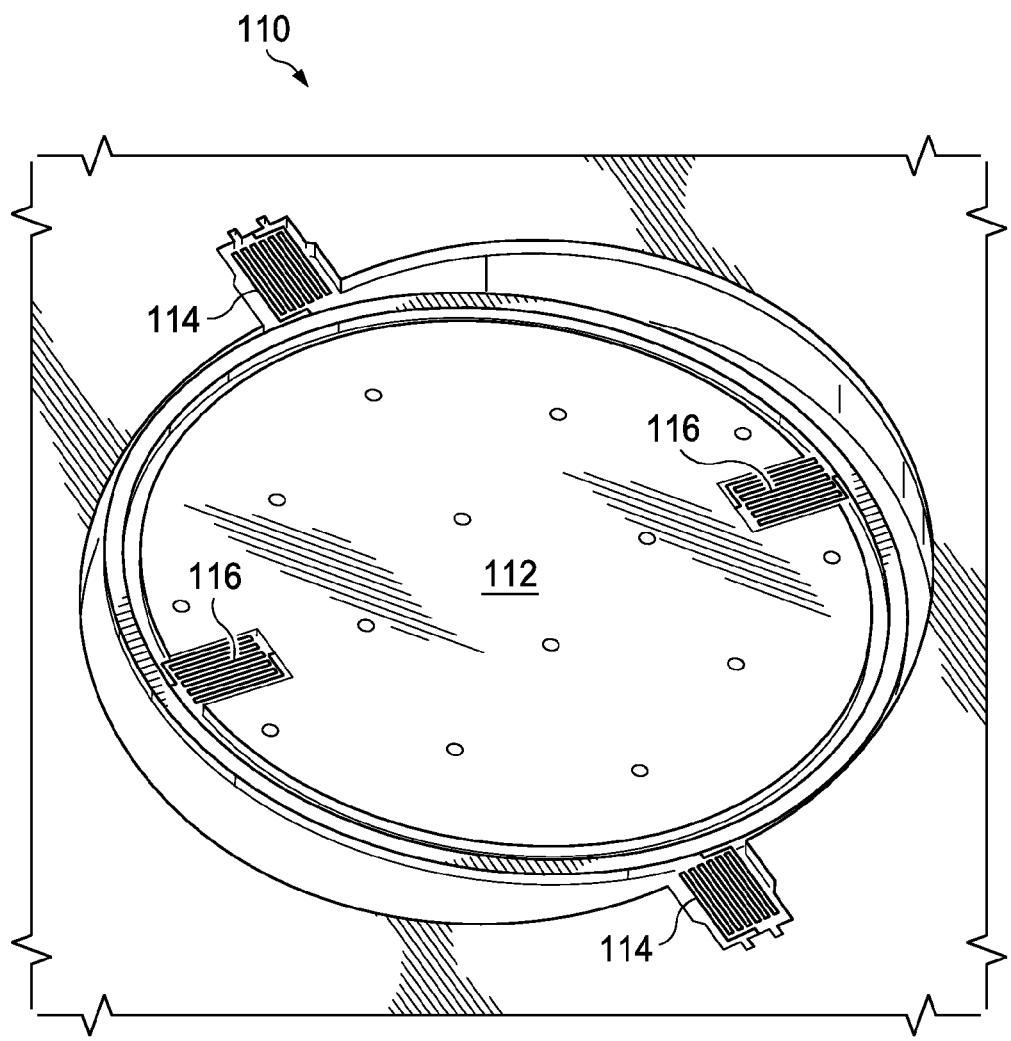
FIG. 2 illustrates an embodiment MEMS mirror structure.

The MEMS mirrors in MEMS photonic switch 100 are fabricated in a modified silicon wafer process. FIG. 2 illustrates an example MEMS mirror structure 110, which may have a diameter from about 550 µm to about 2.5 mm, for example around 1 mm. MEMS mirror structure 110 contains mirror 112 suspended on two axes of bearings 114 and 116 to allow it to tilt against the torsion spring actions of the bearings, which try to maintain mirror 112 in a particular position. Below mirror 112 by from about 80 µm to 100 µm for a 1 mm mirror are three or four segmented plate deflection electrodes.

When four electrodes are used, each electrode is associated with a mirror quadrant. When a voltage is applied to an electrode, mirror 112 is attracted towards that electrode by electrostatic attraction, and twists against the spring action of the silicon torsion springs. This deflection may be steered in both angular direction and magnitude by adjusting an applied drive voltage on one or more of the electrodes. Drive voltages may be up to a few hundred volts, with a maximum mirror deflection of five to seven degrees out-of-plane, for a maximum beam deviation of ten to fourteen degrees from the rest state, or a twenty to twenty eight degree peak to peak beam deviation.

Figure 3A:
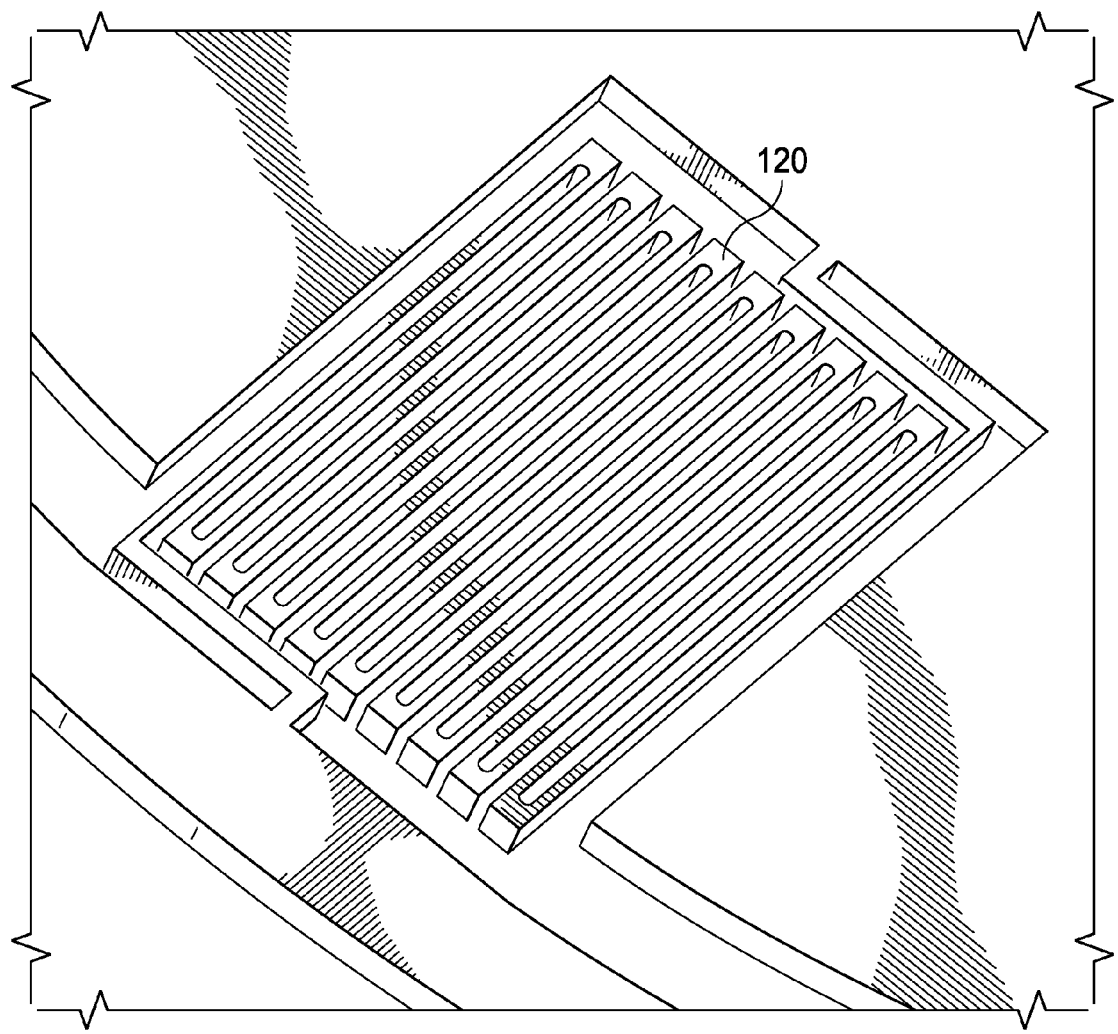
FIGS. 3a-b illustrate embodiment gimbals for MEMS mirrors.
Figure 3B:
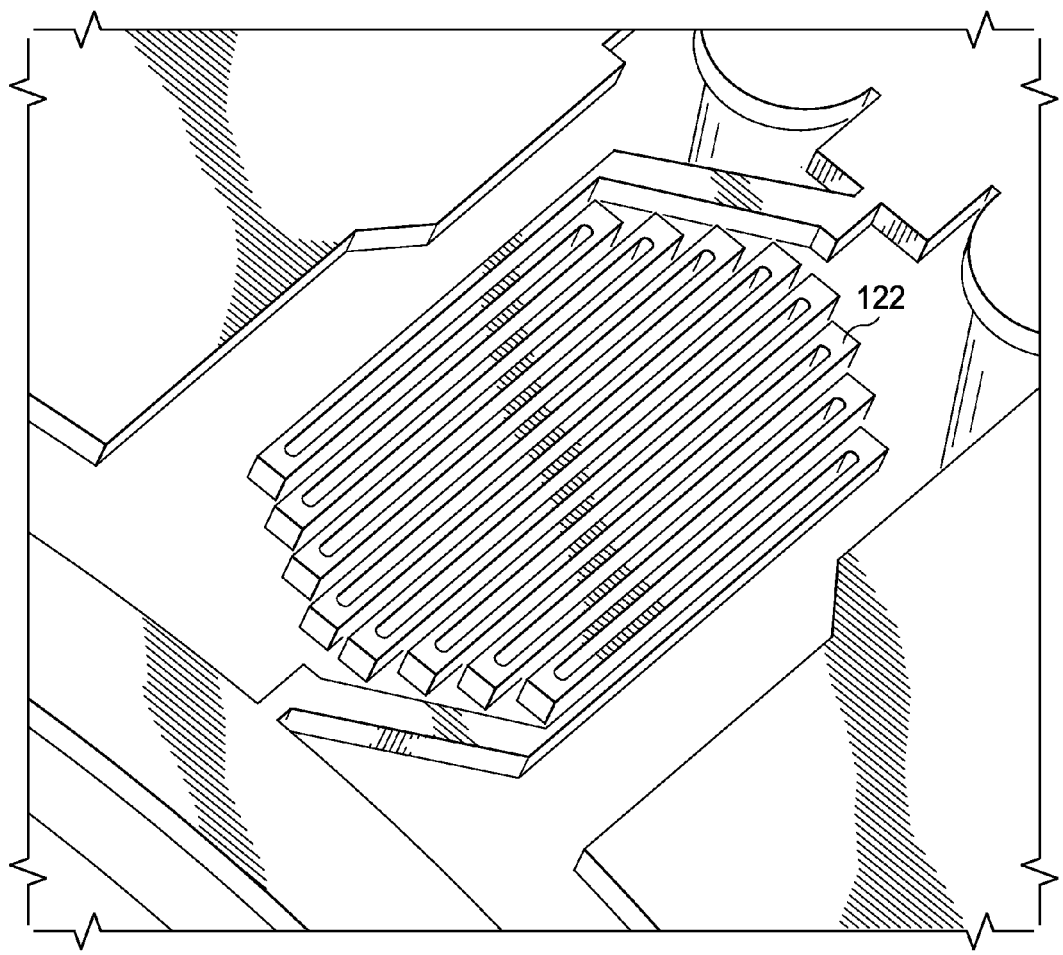

FIG. 3a illustrates gimbal 120 and FIG. 3b illustrates gimbal 122, two examples of gimbals that may be used as bearings 114 or bearings 116. Gimbal 120 and gimbal 122 may be fabricated from silicon torsion springs, which try to return the mirror to its planar position. The attractive force of the drive voltage versus the increasing spring tension forces as the mirror is moved determines the final pointing angle of the mirror.

Figure 4:
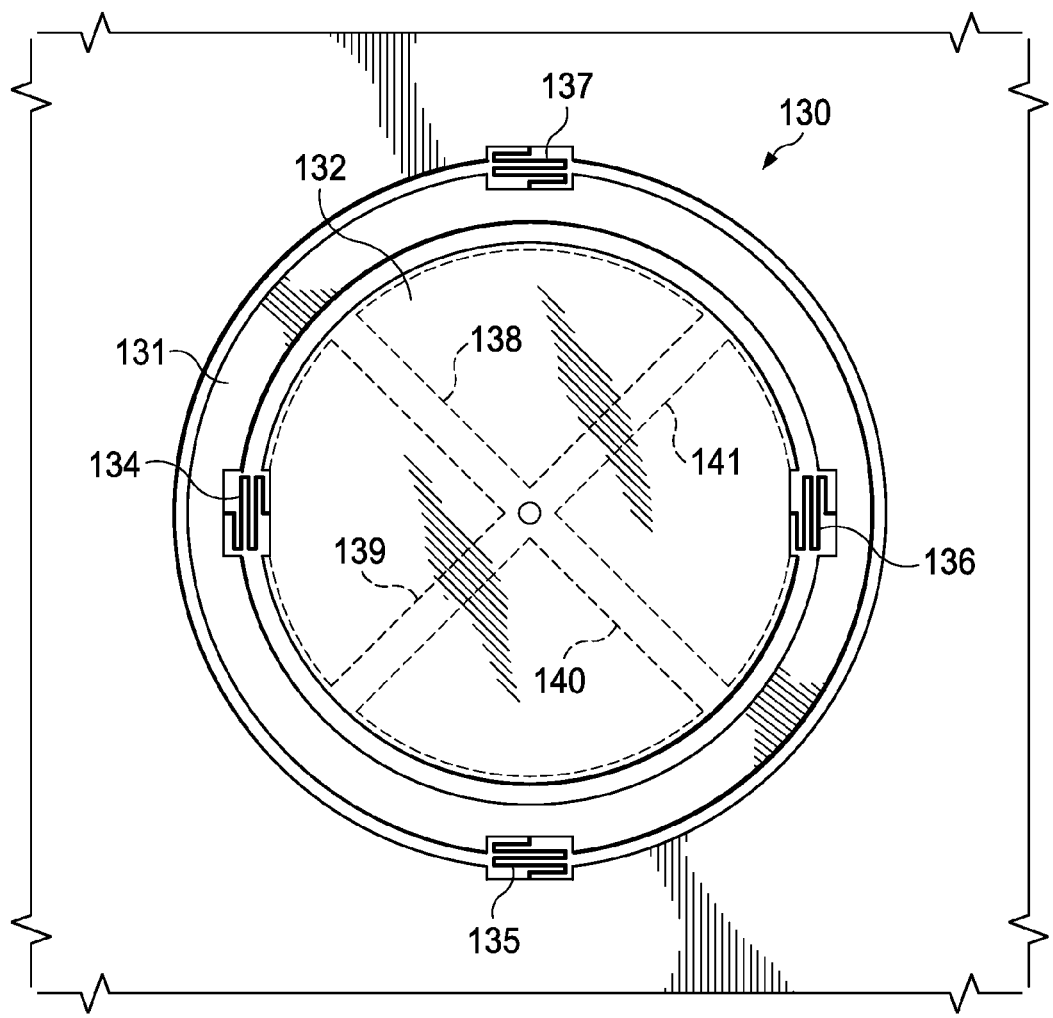
FIG. 4 illustrates another embodiment MEMS mirror structure.

FIG. 4 illustrates mirror structure 130, which contains gimbaled moveable mirror 132 supported by a gimbal ring 131 with y-axis pivoting and x-axis pivoting. Movement in the x-axis is facilitated by springs 135 and 137 which act as pivots, and movement in the y-axis is facilitated by springs 134 and 136, which act as pivots in the orthogonal axis.

The deflection angle of the mirror is adjusted along these two axes, formed between springs 135 and 137, and between 134 and 136 by using electrodes 138, 139, 140, and 141. Applying a drive voltage to electrode 138 causes the mirror to be attracted toward that electrode, causing the mirror to twist against the spring action of torsion springs 135 and 137, until the attractive force of the electrodes is balanced by the torsion force of the spring, resulting in a negative x mirror deflection. In a similar manner, drive voltages applied separately to electrodes 139, 140 and 141 can produce a negative y, positive x or positive y deflection. The attractive force is proportional to the potential difference between the mirror and the electrode. Hence, for a ground potential mirror, the polarity of the drive voltage on the mirror is insignificant, and the opposite pairs of electrodes are not driven differentially. However, one of the electrodes in the x-axis and one of the electrodes in the y-axis can be driven to produce deflection angles containing any combination of x and y components. The mirror can be pointed to "all points of the compass" by a suitable combination of x and y electrode drive voltages.

The alignment of mirrors in MEMS photonic switches may be controlled by analyzing the output light. Until the output port receives at least some light from the input port, light cannot be detected, and therefore alignment cannot be optimized. Thus, it is desirable that an initial blind connection be set up to achieve some light on the output port. This can be achieved by a complex method involving pre-measurements of deflection voltages required to produce specific deflection angles and a cyclic hunting approach, known as precession. These values are stored for future reference and use. During the MEMS array/module manufacturing process or equipment field commissioning, each MEMS mirror in each array is linked to every mirror in the opposing array by a trial and error approach. The x and y drive voltages are ramped around the expected drive voltage until a connection is made. The x and y drive voltages for connecting each mirror to every mirror on the opposing mirror array are then stored. This is a time-consuming activity, and can generate large tables of values. Hence, using an analog drive, analog angle deflection system, the initial manufacturing or commissioning setup uses drive voltages to link every other mirror in the array. A detailed look-up table with drive voltages for the alignment of each mirror of one mirror array with each mirror on the opposing mirror array may be created in this manner, either during manufacturing testing or as part of a commissioning process and stored in memory. Alternatively when an extremely consistent mirror deflection sensitivity is combined with a complex precision computation algorithm, the initial approximate drive voltages can be computed directly.

Once the mirror pair connectivity has been approximately aligned, such that light passes over the path from the input to the output, but the optimal performance has not been obtained, and detection of output power indicates that the link has been acquired. However, the acquired link is not optimized, and partial illumination of the face of the output collimator (or of the second mirror) will produce an output—but with significant impairment. Hence, the connection may now be optimized. This optimization involves moving the mirrors to the point of the lowest path loss. Once the optical path is acquired, a low optical power indicates that the path is not optimized. However, this only provides an approximate indication of the amplitude of the error, and provides no information about the direction of the error.

A control design may be used to align mirrors by applying precession in an orbital movement to the mirrors by superimposing a small level of sine wave and cosine wave modulation to the x and y plate drive voltages, respectively. This causes the mirror positions to very slightly precess around their nominal position, causing minor circular modulation of the mirror angles. The output light has an amplitude modulation at the precession frequency. The amplitude of this modulation provides an estimate for the size of the error, while the phase of the modulation indicates how much of the error was contributed to by the sine wave modulation and how much was contributed to by the cosine wave modulation. A correction vector may then be calculated to better align the mirror pairs. By using different precession frequencies for the opposing mirror arrays, measurements of the frequency of the precession signal indicate which mirror needs to be corrected. Alternatively, precession may be performed separately and sequentially on each mirror array. The latter method has a longer optimization process.

An initial approximate alignment may be based on a look-up table with drive voltages for aligning each mirror of one mirror array with each mirror of the opposing mirror array. The look-up table is extremely large. For example, for a MEMS photonic switch with 1000×1000 mirrors, there are four million entries in the look-up table with 1000 mirrors per array multiplied by 1000 x-angle drive voltages and 1000 y-angle drive voltages per mirror, multiplied by two arrays. Then, coarse orbital precession may be performed, until an initial alignment is established and there is a significant amount of output light. Next, fine precession is performed to optimize the alignment. Periodic in-service fine precession is performed to maintain alignment during operation.

During initial alignment, when the initial alignment of the mirrors does not produce any light on the desired output port alignment or insufficient light is on the desired output port, the precession signal may be ramped up, causing the mirror angle to spiral outwards around the initial angle, eventually producing light on the desired output in coarse precession. The timing and phasing of the output signal may be used to compute a correction vector. Once the optical path is approximately aligned on the output port, fine precession at a lower precession amplitude, combined with measuring the amplitude and angle of modulation of the output light, may be used in a control loop to further align the mirror pair.

Figure 5:
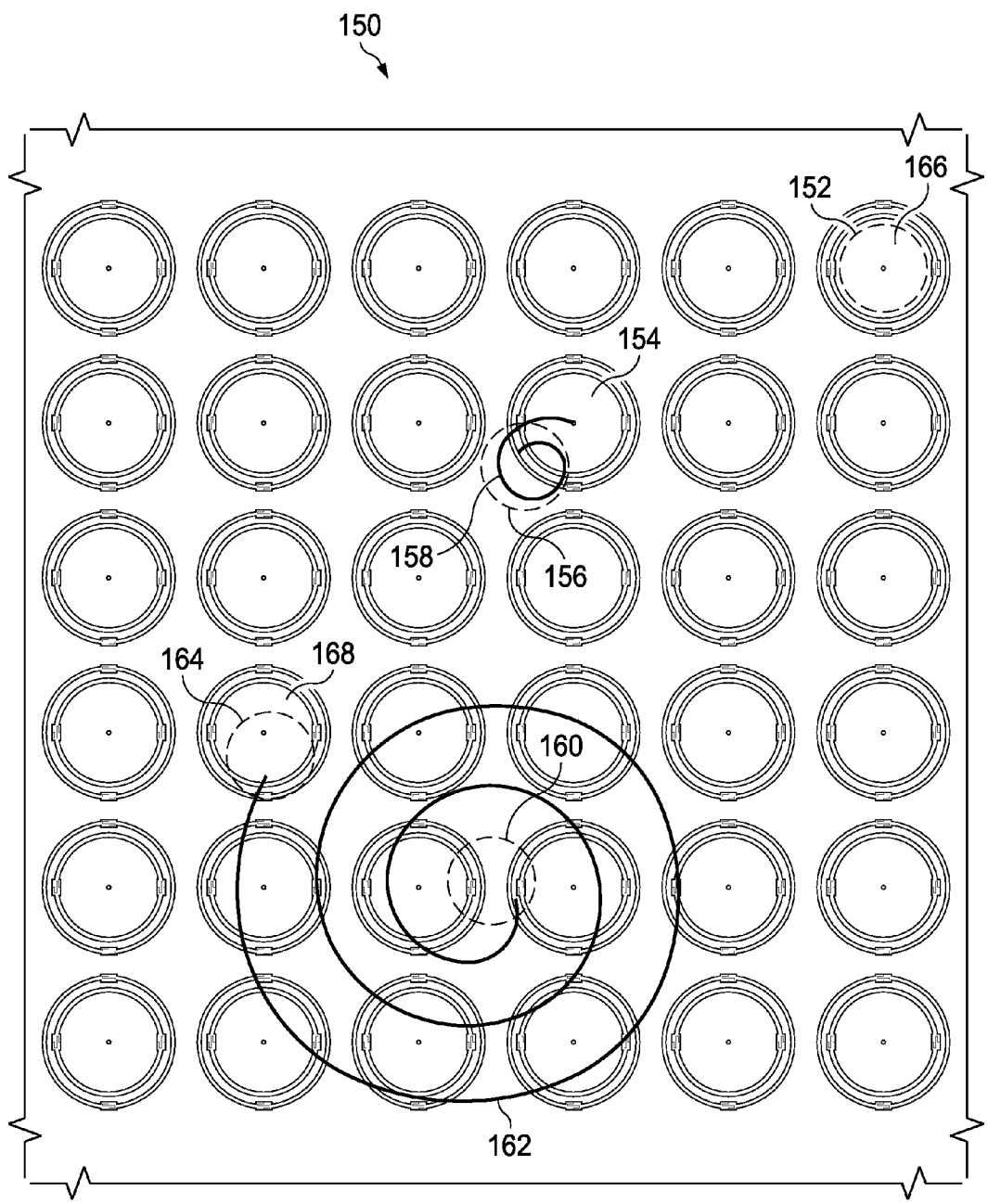
FIG. 5 illustrates optical beam spots on an embodiment MEMS mirror array.

FIG. 5 illustrates mirror array 150. Initially, light beam 156 falls partially outside of target mirror 154. The light beam angle is varied in precession pattern 158 using fine precession to align it on target mirror 154. Also pictured, light beam 152 is properly aligned on target mirror 166.

Light beam 156 was initially aligned from a precise look-up table with a small error. For a 100×100 mirror array, a look-up table has to store the x axis and y axis drive voltages for each mirror in a mirror array to point at each mirror of the opposing array has a table of 2*100*100*2=40,000 drive voltage levels. For a 1000×1000 mirror array, there are 4 million drive voltage measurements. Additionally, it is time consuming to determine the look-up table entries, and the look-up table does not take into account drift or aging. As devices age, these the drive voltages may shift, leading to a more approximate initial alignment. When the initial alignment drifts far, some level of coarse precession may be used. Alternatively, a mechanism to automatically update the table contents with the latest values from the actual optimized settings may be used. This may be problematic when the period between the uses of a particular mirror pair combination is very large. The initial look-up table values are generated by measuring them at manufacturing or commissioning. About ten to thirty values may be measured in a second, leading to a 1300 to 4000 second measurement for a 100×100 array, and a 130,000 to 400,000 seconds (35-110 hours) for a 1000×1000 array.

When the light from the initial blind mirror positioning falls far from the desired mirror, a larger spiral pattern may be used with coarse precession may be used before fine precession. Light beam 160 is initially aligned using an approximate calculation or from a look-up table with a large error. Light beam 160 is a few mirror lengths away from, not close to, target mirror 168. The light beam is precessed using spiral pattern 162, until light beam 164 is close to target mirror 168. Spiral pattern 162, as pictured, is coarser than a spiral that would actually be used for coarse precession for illustration. After coarse precession, a smaller precession pattern is used to better align the mirror pairs. If a precession rate of 1-2 kHz is used for one mirror, a precession rate of about 50 Hz or a non-harmonic frequency in the 1-2 kHz range is used for the opposing mirror. This may be a long process that crosses several non-target mirror sites, because all combinations of both mirror precessions may be needed for the optical beam to illuminate the target mirror.

Figure 6A:
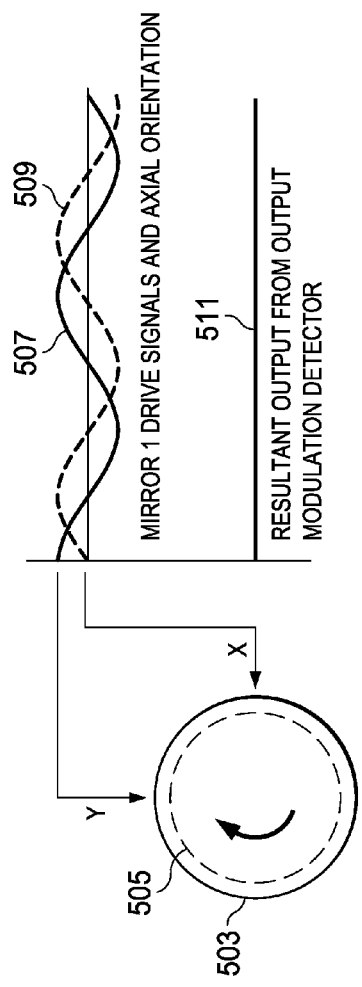
FIGS. 6a-b illustrate drive signals, output modulation, and beam positions for a MEMS photonic switch.
Figure 6B:
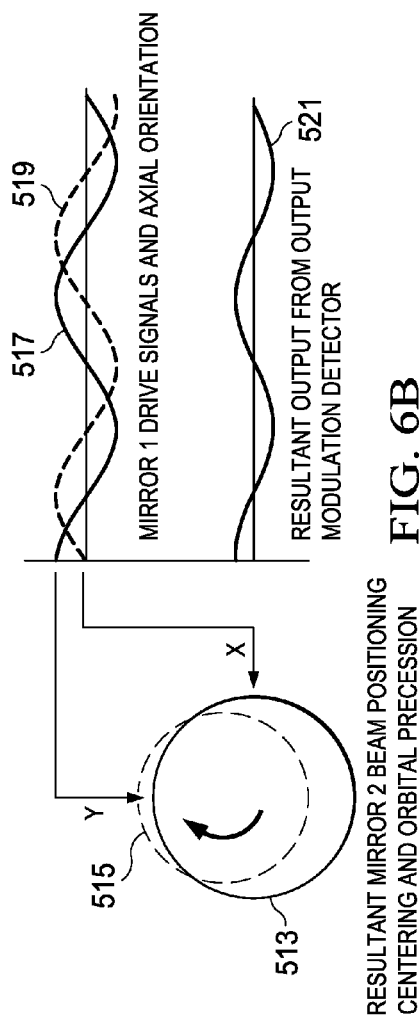

FIGS. 6a-b illustrate the effects of precession of an optical beam. Sinusoidal modulation at zero and ninety degrees is applied to the x and y axes electrodes, causing a small orbital movement of the mirror and a small orbital motion of the beam spot on the opposing mirror or collimator. FIG. 6a shows beam 505 is centered on target mirror 503. Curve 507 illustrates the drive signal for the x axis, and curve 509 shows the drive signal for the y axis. Because the beam is centered, no modulation is detected at the output in curve 511. On the other hand, FIG. 6b shows beam 515 is slightly offset from the center of target mirror 513. Similar drive signals in the x and y axes are applied, shown by curves 517 and 519, respectively. Because the beam spot is offset from the target mirror, output 521 has a modulation. The amplitude of the modulation indicates the magnitude of the error, and the phase indicates the angle vector of the error.

Using coarse precession and fine precession may be complex. Also, the control loop may be slow. The control loop has to acquire an optical signal before it can set up optical connections. The precession frequency is at a low frequency that the mirrors can follow without a significant positional lag, for example from about 300 Hz to less than about 2 kHz, limited by the fidelity of the MEMS mirror movement staying in phase with the modulation, with a slow control loop and a relatively long optical path optimization time, for example tens or hundreds of milliseconds. The control loop is low bandwidth. When the mean position of the mirror is controlled by a fast-edged drive signal the mirror position experiences ringing or bouncing. The effects of vibrations are not controlled, because their high frequencies of from about 1 kHz to about 10 kHz are outside the control loop bandwidth. Hence, the application of a drive signal should be sufficiently slow to avoid triggering this mechanical resonance. This limits the switching speed as well as the precession speed, since the relationship between the precession signal phase and the mirror angular pointing phase is very uncertain near a mechanical resonance. To extract a sufficiently large precession envelope signal, significant optical power should be available at the switch output, which may limit the lower end of the dynamic range of the optical power switched through the fabric.

The optical signal used in coarse and fine precession from an external source may contain any form of data modulation, since it may be a modulated traffic signal, with a high level of broadband spectral components to its modulation. Using this optical signal to control and correct the mirror settings during alignment or to monitor and correct tracking activity once the mirrors are aligned, may be problematic. Any traffic modulation component of the optical signal power at a frequency close to the mirror precession frequency may mimic a detected precession error, causing an unnecessary and inaccurate resetting of mirror angles. This leads to error conditions in the control system or a high interferer to precession component levels and possible degradation or loss of control. Because the form of the traffic information and its modulation is unknown, the band-limited noise contribution from the part of the carrier signal spectrum that falls within the pass band of the precession modulation control system is unknown. Hence, the control circuit is designed to be as low bandwidth as possible to minimize the potential for interference from traffic spectral components, leading to slow detection of precession signal changes and slow operation.

Figure 7:
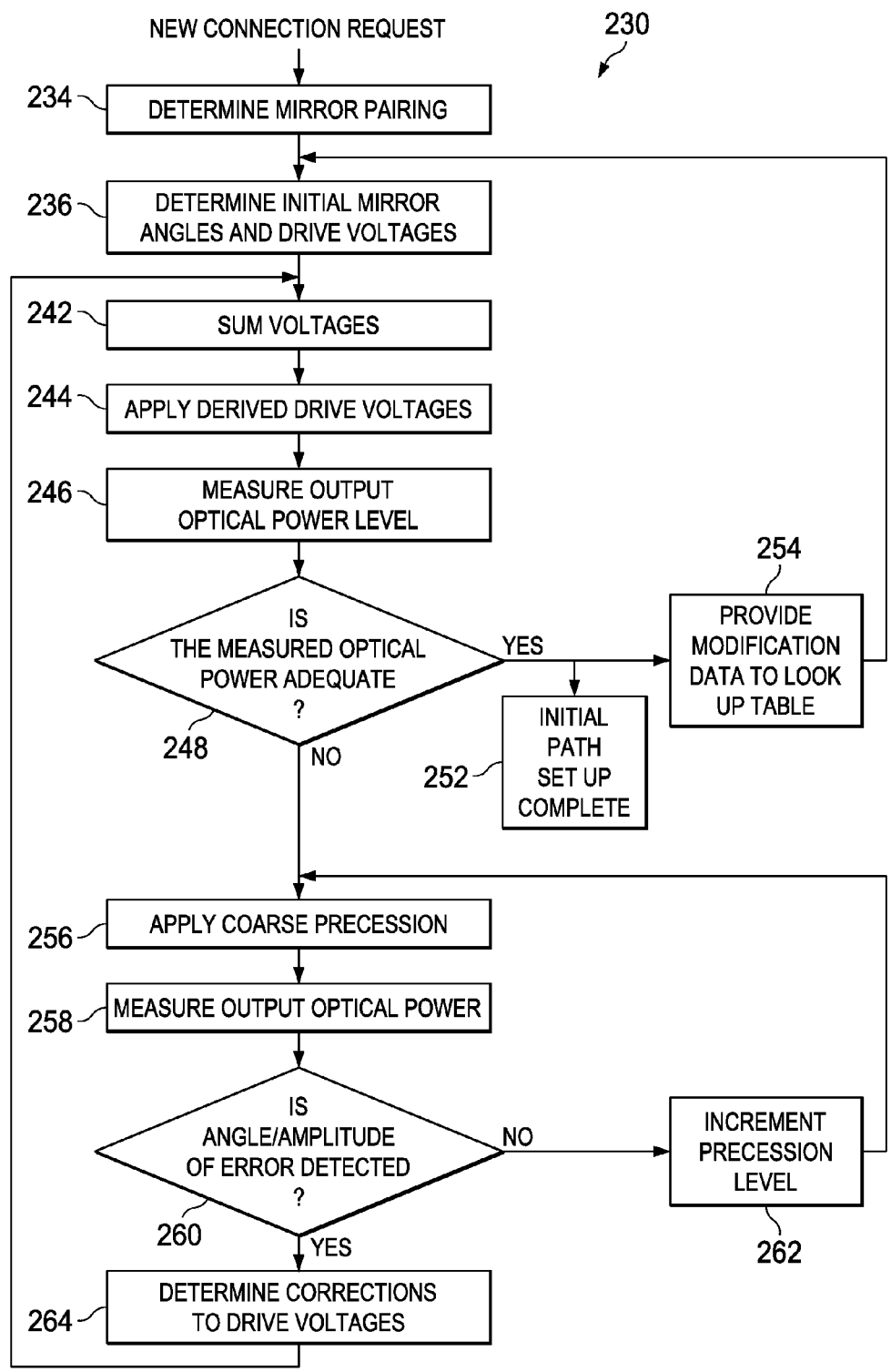
FIG. 7 illustrates a flowchart of an embodiment method of aligning MEMS mirrors.
Figure 8:
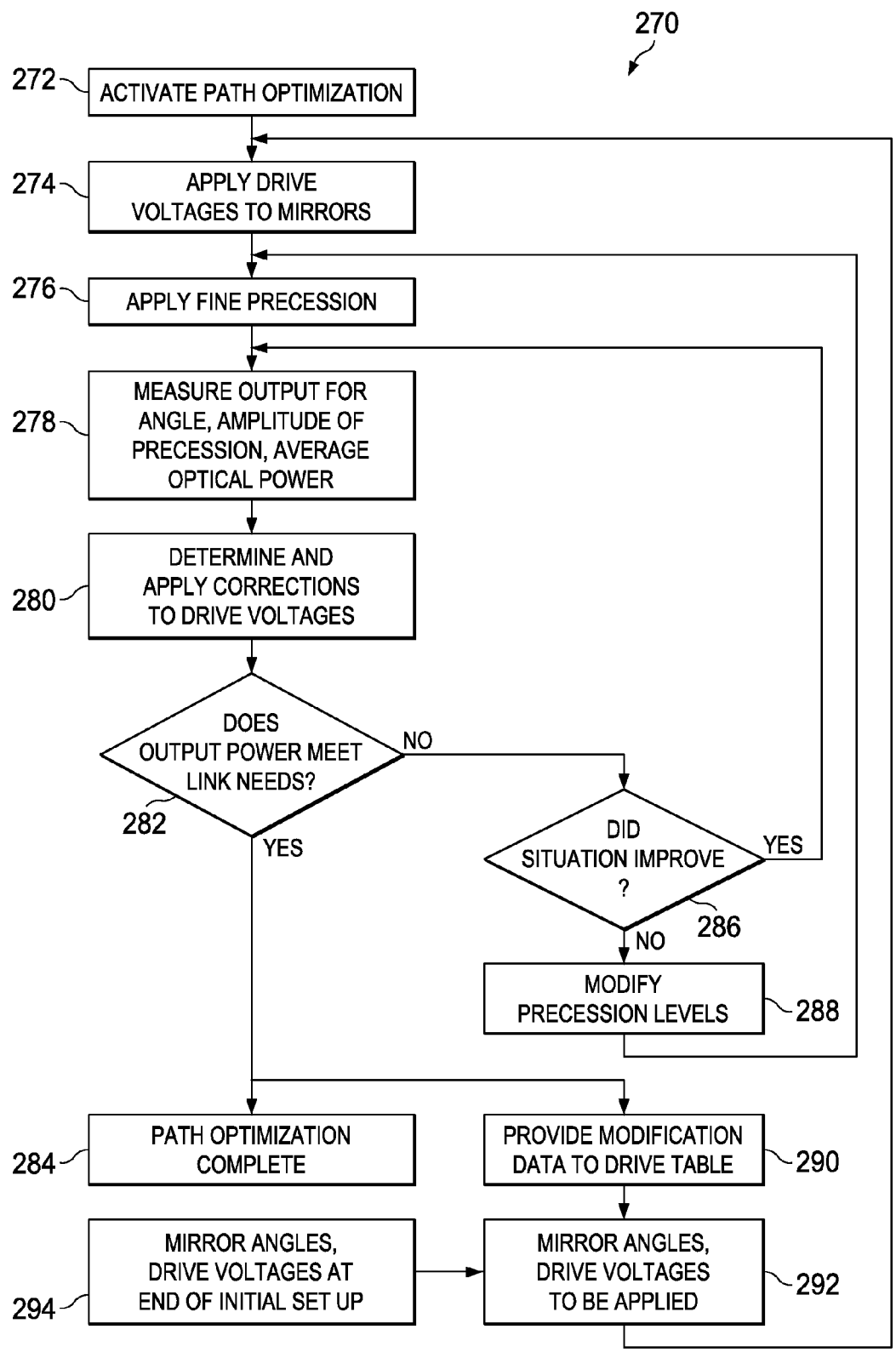
FIG. 8 illustrates a flowchart of another embodiment method of aligning MEMS mirrors.
Figure 9:
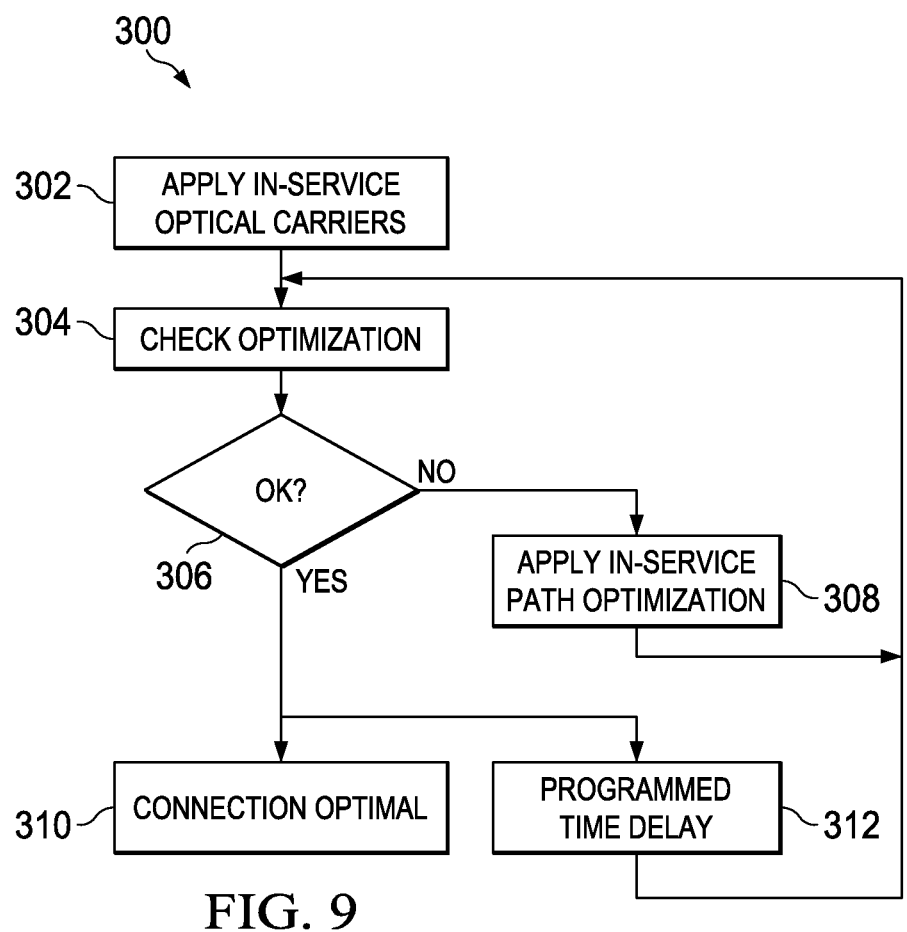
FIG. 9 illustrates an a flowchart of an additional embodiment method of aligning MEMS mirrors.

When a mirror pair connection is set up, an optical beam is initially aligned and coarse precession is performed if necessary. FIG. 7 illustrates flowchart 230 for a method of coarse precession. When coarse precession is unnecessary or has already been performed, fine precession is performed. FIG. 8 illustrates flowchart 270 for a method of performing fine precession. Finally, while the mirror connection is in service, periodic in-service precession is performed to maintain alignment. FIG. 9 illustrates flowchart 300 of performing a method for periodic in-service precession. Precession may be performed on a MEMS photonic switch, such as MEMS photonic switch 100.

Initially, in step 234, a mirror pairing is determined, for example when a new connection request is received. In one example, the new connection request is from an external source. In another example, the new connection request is calculated, for example when the MEMS photonic switch is part of a three stage CLOS network. Based on the new connection request, a mirror pairing is determined.

Next, in step 236, the initial mirror angles and drive voltages are determined. In one example, the initial mirror angles and drive voltages are determined using a detailed look-up table. In another example, the initial mirror angles are computed from an algorithm. If the manufacturing geometries are accurate, and the mirror arrays are parallel, the angles applied to opposing mirrors are of the same magnitude but opposite in direction. Then, the drive voltages are computed from the initial mirror angles, based on the deflection sensitivity of the MEMS mirror design.

Then, in step 242, a correction voltage, if one is required, is added to the drive voltage determined in step 236. In the first iteration, no correction voltage has yet been derived, and the initial drive voltages are directly passed on.

In step 244, the drive voltage is applied to the mirrors.

The output optical power is measured in step 246.

Whether the optical power measured is adequate is determined in step 248. When the measured optical power is adequate, the initial setup is complete, in step 252, and the system proceeds to fine precession, illustrated by flowchart 270. Also, in step 254, the look-up table is optionally modified. When the measured optical power is not adequate, coarse precession is performed, beginning in step 256.

In step 256, the coarse precession is applied. Opposing mirrors cannot be precessed at the same rate, because both mirrors must simultaneously be aligned for light to pass. The precession spirals may be applied at radial frequencies which do not have a harmonic relationship with each other, so the repetitive application of the precession spirals in all combinations of angles is tested. Alternatively, the precession spirals are applied at vastly different rates so that the angular options on one mirror are applied before significant movement of the other occurs.

Then, in step 258, the output optical power is measured.

Whether the angle and amplitude of the error has been detected is determined in step 260. When the angle and amplitude of the error is not detected, the precession level is incremented in step 262, and the next precession level is applied in step 256. When the angle and amplitude of the error is detected, the correction to the drive voltage is determined in step 264. Then, this correction is added to the drive voltage in step 242, and the updated drive voltage is applied in step 242. Then, steps 244 and 246 proceed again, leading to a determination at step 248 as to whether the measured output power is adequate. At this point, the precession sequence (steps 256 to steps 264) is repeated if the measured power output is not adequate. The coarse set up process completes at step 252 if the measured power output is adequate.

After the beam is illuminating a sufficient part of the collimator, fine optimization is performed, as shown in FIG. 8. In step 272, path optimization is activated.

Then, in step 274, a drive voltage is continued to be applied to the mirror pair. The drive voltages are based on the mirror angles and drive voltages at the end of the initial setup from step 294 for the first fine precession iteration. For subsequent iterations, they are modified by modifications to the drive table in step 292.

Next, in step 276, fine precession is applied. The precession applied in step 276 is of a smaller magnitude than that applied in coarse precession.

In step 278, the output for the angle and amplitude of modulating is measured. Also, the average optical power is determined.

A correction to the drive voltage is determined in step 280 based on the measured optical power and the modulation. The corrected drive voltage is also applied.

In step 282, it is determined whether the output optical power meets the link needs. When the output meets the link needs, the path optimization is complete in step 284, and modification to the drive table is performed in step 290. The mirror pair connection is placed in service. Then, the mirror angles and drive voltages to be applied is determined in step 292 based on the modified drive table and the mirror angles and drive voltages at the end of the initial setup.

When the output optical power does not meet the link needs, it is determined whether the output optical power has improved in step 286. When the output optical power has improved, the output is again measured in step 278. When the output optical power has not improved, the precession level is modified in step 288. Then, the new precession level is applied in step 276.

In one example, fine precession is performed simultaneously to both mirrors. In another example, fine precession is first performed on one mirror, and then on the other. This may need to be performed more than once, because optimization of one mirror is somewhat affected by the other mirror.

While the mirror pair connection is in service, periodic adjustments of the alignment, illustrated by flowchart 300 in FIG. 9, may be performed. In service optical carriers are applied in step 302.

Then, optimization is checked in step 304, and whether the optimization is satisfactory is determined in step 306. When the optimization is satisfactory, the connection is optimal in step 310, and a programmed time delay is applied in step 312. When the connection is not sufficiently optimized, in-service optimization is performed in step 308. This is another iteration of fine precession. For example, the method illustrated by flowchart 270 may be performed.

Figure 10:
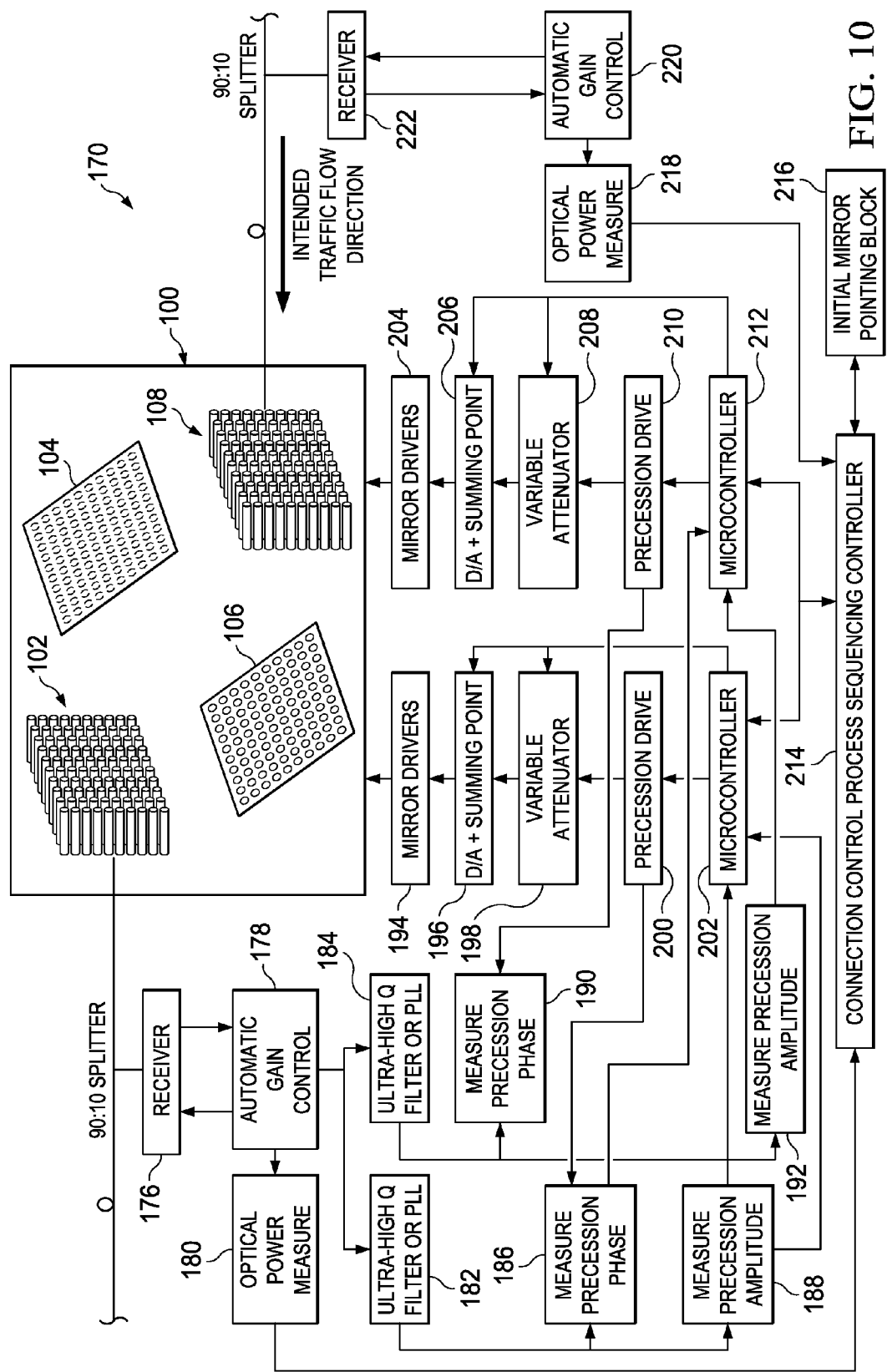
FIG. 10 illustrates an embodiment control system for aligning MEMS mirrors.

FIG. 10 illustrates control system 170 for aligning MEMS mirrors. A connection request is received by connection control process sequencing controller 214, which translates the connection request to which mirror on mirror array 106 should be pointed at which mirror on mirror array 104. The specific mirrors may be addressed, for example, by row and column. Connection control process sequencing controller 214 receives the initial angles for the mirrors from initial mirror pointing block 216. In one example, initial mirror pointing block 216 determines the appropriate pair of mirror address from a look-up table. In another example, initial mirror pointing block 216 applies a pointing algorithm to the pair of mirror addresses. This algorithm may be based on the row and column locations of the mirrors and the mirror pitch and spacing between mirror array 106 and mirror array 104. The algorithm derives a beam deflection angle to connect the mirrors based on the physical geometry of the optical path. From the mirror pointing angles and known drive voltages and deflection angles of the mirrors, the desired drive voltages are derived.

The drive voltages are passed to microcontroller 202 for mirror array 106 and microcontroller 212 for mirror array 104. The drive voltage for the mirror on mirror array 106 is passed to digital-to-analog (D/A) and summing point block 196 through precession drive block 200 and variable attenuator 198, while the drive voltage for the mirror on mirror array 104 is passed to D/A and summing point block 206 through precession drive block 210 and variable attenuator 208. D/A and summing point blocks 196 and 206 convert these drive voltage values to analog drive voltages and apply them via mirror drivers 194 and mirror drivers 204, respectively, to the deflection electrodes of mirror arrays 106 and 104.

An optical input is injected into a collimator of collimator array 108. The injected optical beam propagates to mirror array 106, where it is reflected by the appropriate associated mirror. The optical beam then travels to mirror array 104, where it is reflected off of the appropriate associated mirror to a collimator of collimator array 102. The optical output then goes to receiver 176.

The optical output power is measured by receiver 176. When optical power is detected above a fairly low threshold, the connection control process sequencing controller proceeds to fine precession. The threshold may be adaptive, for example based on the measurement of the input optical power. When receiver 176 the detected optical power is below the threshold, connection control process sequencing controller 214 commences coarse precession.

When coarse precession is performed, connection control process sequencing controller 214 instructs microcontrollers 202 and 212 to set a low but steadily increasing level of precession to both opposing mirrors in the intended optical path. The precession values are passed to precession drive blocks 200 and 210, then to variable attenuators 198 and 208, and D/A and summing point blocks 196 and 206. The precession frequencies are chosen to permit the cycling of the mirrors through all combinations of precession values for the two mirrors up to a preset limit determined by the tolerances of the initial alignment process. For example, if the initial pointing process maximum pointing error level is 1.5 mirror diameters, the precession signal is ramped up to an orbital radius of the beam landing on the opposing mirror or collimator of 1.5 mirror diameters, then down to a zero in a cyclic manner. Meanwhile, the other mirror in the path performs the same sequence at a different precession rate or frequency.

The output optical power is measured by optical power measure 180, via automatic gain control 178 and receiver 176, or in optical power measure block 218, via automatic gain control 220 and receiver 222. The values of the modulation in phase and amplitude are noted. Precession is frozen at this amplitude, causing the output to experience a series of flashes or a continuous but modulated output, where the modulation is at one or both of the precession frequencies. The output is received by receiver 176, a broad optical bandwidth wide dynamic range optical receiver. Receiver 176 passes the received demodulated light envelope signal to automatic gain control 178, which passes it on to ultra-high Q filter or phase locked loop (PLL) 182 and ultra-high Q filter or PLL 184, which contains one filter or PLL for each frequency.

Ultra-high Q filters or PLLs 182 and 184 are narrow bandwidth filters which extract the precession modulation signals from the background noise of the spectral density of modulation of the optical signal. The extracted precession signals are passed to measure precession phase blocks 186 and 190 and measure precession amplitude blocks 188 and 192. The phase is measured by measure precession phase blocks 186 and measure precession phase block 190 for the two frequencies. The measured phases are compared to the original precession reference phase to determine the phase offset, which indicates the approximate direction of the mirror pointing error. Also, the amplitudes are measured by measure precession amplitude blocks 188 and 192. The amplitudes indicate the magnitude of the mirror pointing error. The angle and magnitude of the mirror pointing error are provided to microcontrollers 202 and 212.

Microcontrollers 202 and 212, in connection with connections control process sequencing controller 214, compute a correction level for the drive voltages to apply to the two opposing mirrors. These drive voltages are fed to mirror drivers 194 and 204 and applied to the mirrors. The result is measured in terms of whether the optical signal at the output port now meets the threshold for coarse precession. When the optical signal meets the threshold, coarse precession ends. When the optical signal does not meet the threshold, coarse precession is repeated.

Fine precession may occur simultaneously for opposing mirrors, or sequentially, first for one mirror, then for the opposing mirror. In fine precession, the optical link is fine tuned to optimize the optical link. The mirror alignment is fine tuned. Low levels of mirror precession are applied to the mirrors, either together or alternately, and the amplitude and phase of the precession modulation of the output optical carrier envelope are measured at the output.

Because fine precession continues, either periodically or continuously, while the switch is in service, the level of fine precession is kept to a level where it does not disrupt or impair the traffic optical carrier and its ability to carry information. This may be from about 0.5% to about 2% amplitude modulation.

The procedure for fine precession is similar to that used in coarse precession, with a smaller precession amplitude. The precession is applied, and the output signal precession envelope phase and magnitude are determined. Corrections are applied to the mirror drivers to reduce the amplitude of the output precession. If the amplitude drops to zero, the beam is accurately centered. In practice, the finite gain of the servo control loop means that a small level of residual precession remains. Once the loss drops below a preset threshold and the recession sensitivity drops below a present threshold, fine precession is complete, and the switch connection is optimized for in-service traffic.

Figure 11:
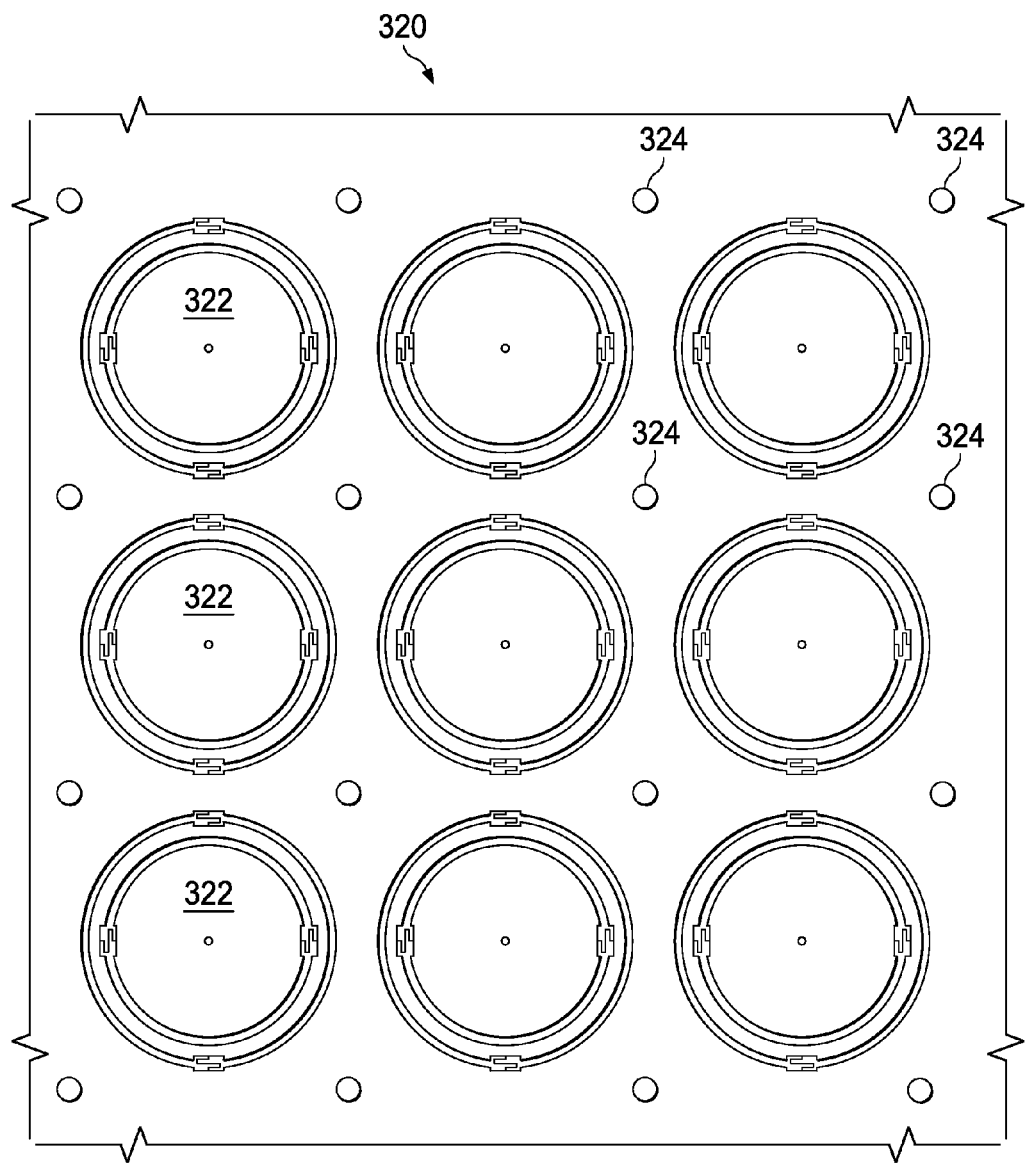
FIG. 11 illustrates an embodiment MEMS mirror array with interstitial photodiodes.
Figure 12:
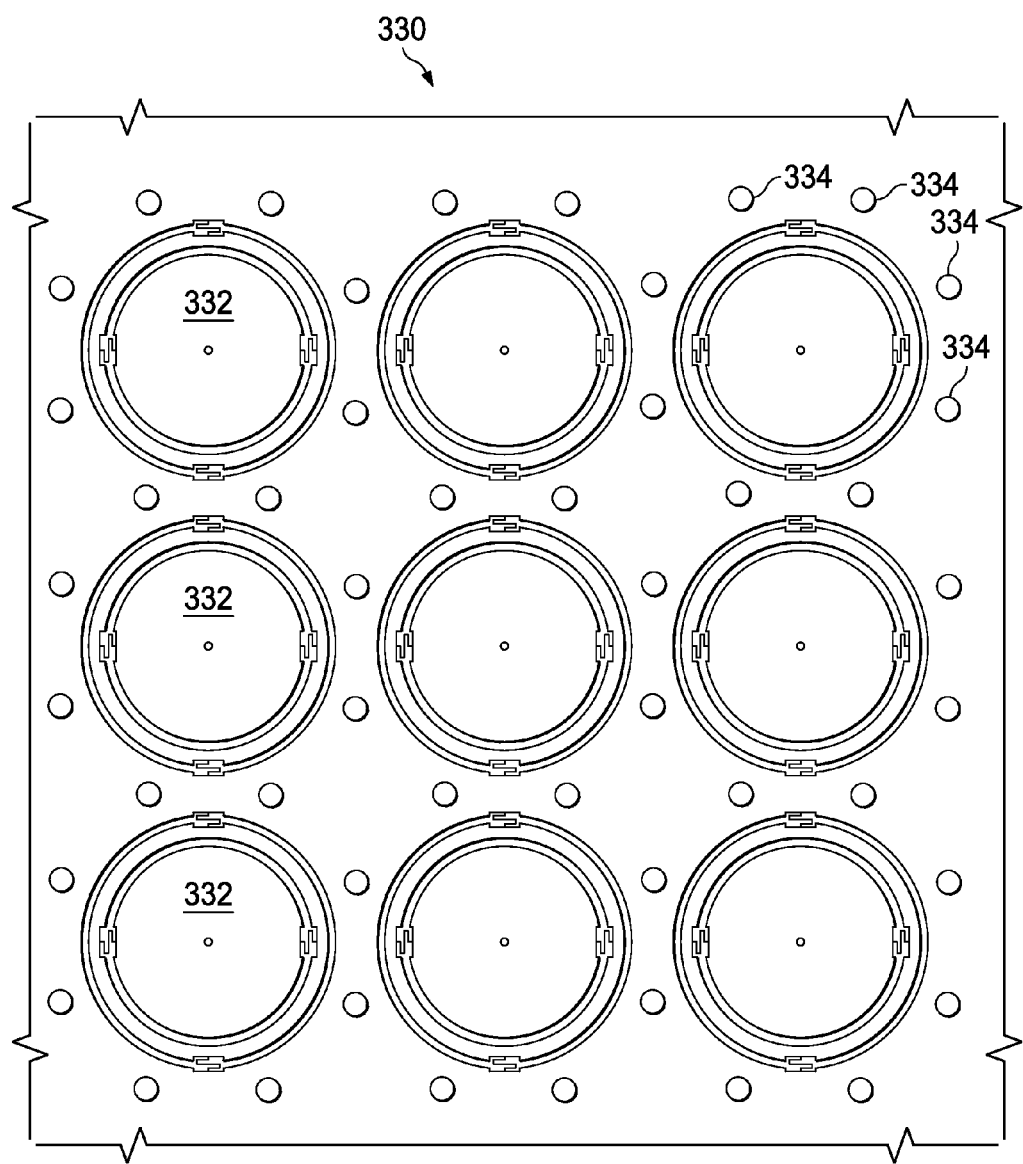
FIG. 12 illustrates another embodiment MEMS mirror array with interstitial photodiodes.

Another approach uses interstitial photodiodes between the mirrors of the mirror arrays to provide the initial mirror-to-mirror alignment in a MEMS photonic switch without using an ultra-precise previously measured look-up table or a slow coarse precession process. This approach may be used for a fast setting up and initial optimization of connections before entry into traffic-bearing service along with fine precession or other approaches to maintain alignment for in-service mirror connections. An interstitial array of photodiodes is placed between the mirrors in the mirror arrays to provide an optical detection grid throughout the mirror arrays. In an example, the mirror arrays are fabricated from silicon. In other examples, the mirror arrays are fabricated from polymers, ceramics, or metals. In one example, the photodiodes are p-type extrinsic n-type (PIN) photodiodes. In other examples, the photodiodes are p-type n-type (PN) photodiodes, avalanche photodiodes, or metal-semiconductor-metal (MSM) photodiodes. These photodiodes may respond only to light at a specific wavelength band that is not at the traffic wavelength. This can be achieved by locally adding an out-of-band control optical carrier. This has several significant advantages, including facilitating the use of integrated silicon photodiodes which are responsive to optical signals in the 800-850 nm band, but are non-responsive at 1300 nm or 1550 nm bands. FIG. 11 illustrates mirror array 320 containing mirrors 322 and photodiodes 324 in a square grid. FIG. 12 illustrates mirror array 330 with mirrors 332 and photodiodes 334 in a circular or octagonal pattern, which is more optimized but more complex. Other patterns using at least 3 photodiodes are possible, such as a hexagonal pattern. Light detected on a photodiode at a known physical location enables an approximate determination of the actual beam landing spot. Detecting light in three or four photodiodes at known physical locations enables the triangulation of the exact center of the beam from the relative power measurements of the photodiodes. When the position of the beam center is determined, a vector to align the beam to the center of the target mirror may be determined. The beam may be artificially enlarged during the alignment process by cyclically dithering the mirrors, and hence the beam, causing the beam to fall on more photodiodes. This cyclic dithering is enlarges the apparent beam spot to cover more photodiodes, and may be carried out using much higher frequencies than conventional precession, since no measurement of precession angles needs to be made, and hence mirror positional lag is not an issue.

Figure 13:
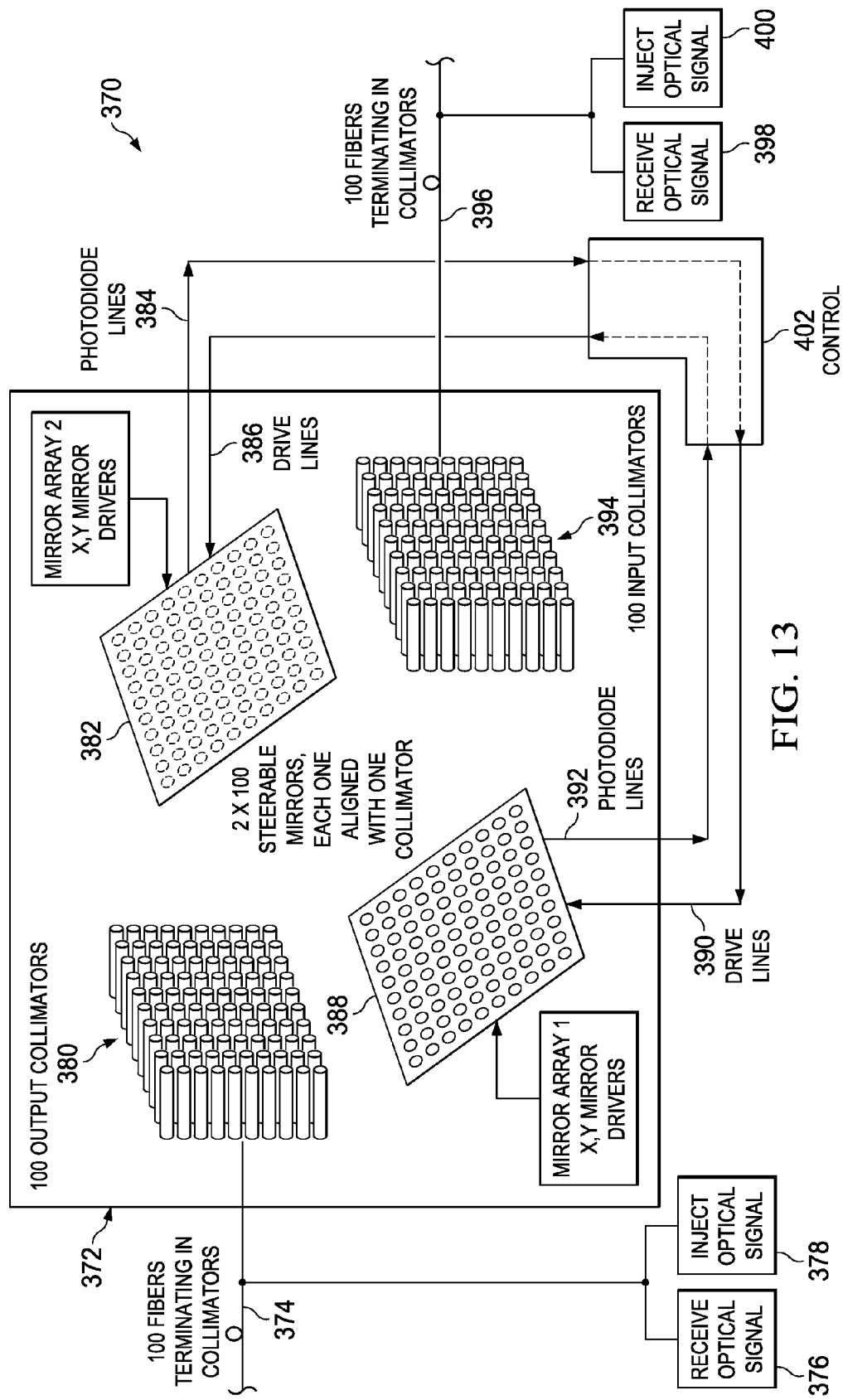
FIG. 13 illustrates an embodiment MEMS photonic switching system with MEMS mirror arrays having interstitial photodiodes.

FIG. 13 illustrates system 370 containing MEMS photonic switch 372. MEMS photonic switch 372 contains collimator array 394. 100 input collimators are pictured in collimator array 394, but more or fewer collimators may be used. An optical signal enters collimator array 394, to a mirror of mirror array 388. Each collimator of collimator array 394 is aligned with a specific associated mirror of mirror array 388. The optical beam is reflected off of a mirror of mirror array 388 to mirror array 382, which also contains MEMS mirrors and an array of photodiodes. The optical beam is reflected off the opposing mirror of mirror array 382 to a specific associated collimator array 380. Each mirror is aligned with a collimator of collimator array 380. Similarly, an optical beam may enter a collimator of collimator array 380, reflect off a specific associated mirror of mirror array 382, reflect off an opposing mirror of mirror array 388, and exit a specific associated collimator of collimator array 394. Collimator arrays 380 and 394 act as lenses, created expanded 0.45 to 1.3 mm in diameter parallel sided collimated beams, which are projected onto mirror arrays 382 and 388. Mirror array 382 and mirror array 388 containing a steerable two axis array of mirrors, which, may, for example, be from about 0.5 mm to about 1.5 mm in diameter. Between mirror array 382 and mirror array 388 is an optical cavity sufficiently large to enable each mirror of mirror array 382 to be aligned with each mirror of mirror array 388. Alternatively, the optical cavity may have one or more large plane or curved mirrors to decrease the physical size of MEMS photonic switch 372. Gradient index (GRIN) lenses may be used as the collimators to facilitate collimated optical beams.

The mirrors can be aimed or steered by applying drive voltages to three or four electrodes under the mirrors. The electrodes may be about 80 μm to 100 μm behind the mirrors. By applying different drive voltages to the electrodes, the mirrors may be pointed at any angle within their maximum deflection range, which may be from about plus or minus five to seven degrees in both the x and y axes. Drive lines 390 the drive voltages for the mirrors of mirror array 388 and drive lines 386 control the drive voltages of the mirrors of mirror array 382. Drive lines 390 and 386 contain one drive line for each electrode. Thus, a mirror array with 100 mirrors having four electrodes each has 400 drive lines.

Mirror arrays 382 and 388 contain interstitial photodiodes placed around the MEMS mirrors. The photodiodes form a mesh across the faces of the mirror arrays, enabling the direct detection of an actual beam landing placement during the initial alignment of a mirror pair. The photodiodes of mirror array 388 are coupled to photodiode lines 392, and the photodiodes in mirror array 382 are coupled to photodiode lines 392. For the photodiode pattern illustrated in mirror array 320, there are 121 photodiodes for an array of 100 mirrors, the relationship between the number of mirrors and number of photodiodes is $p=(n+1)^2$, where p is the number of photodiodes and n is the number of mirrors in a square array. For the photodiode pattern illustrated in mirror array 330, there are 440 photodiodes for an array of 100 mirrors, the relationship between the number of mirrors and number of photodiodes is $p=(n+1)*4n$, where p is the number of photodiodes and n is the number of mirrors in a square array. In one example, there is one photodiode line for each photodiode. In another example, the photodiode outputs are amplified, digitized, and/or multiplexed in electronics physically associated on the mirror array. The associated electronics may be on the front face of an extended mirror array substrate or on the reverse surface of the substrate. These electronics may be fabricated using monolithic or hybridization techniques. Then, fewer photodiode lines are used.

Control module 402 controls the mirrors using drive lines 386 and 390 based on information derived from detected light levels received from photodiode lines 392 and 384.

Optical fibers 374 are coupled to collimator array 380, and 100 optical fibers 396 are coupled to collimator array 394. There is one optical fiber for each collimator. Traffic in optical fibers 374 and 396 are overlaid with control optical signals at an out of band wavelength in both directions. The control optical signals are at wavelengths that are not used for the traffic optical signals at which the photodiodes are responsive. An added advantage of using a separate control signal is that the switch behavior is independent of the properties of the switched optical signal since, if the photodiodes are blind at the traffic wavelengths, the spectral components of that traffic wavelength do not affect the photodiode. Furthermore, the optical power level for the control signal is independent of the traffic signal level, increasing the dynamic range of the allowable traffic signal. Also, the switch may be set up in the absence of a traffic signal. An optical signal is injected from inject optical signal block 378 at a first control wavelength into optical fiber 374, and is propagated through a collimator of collimator array 380, reflected off of a mirror of mirror array 382, reflected off of a mirror of mirror array 388, and exited through a collimator of collimator array 394 to optical fiber 396, where it is received by receive optical signal block 398. The control optical signal is injected into the optical fibers using an optical combiner. Similarly, optical control signal 400 at a second control wavelength is injected into optical fiber 396, through collimator array 394, reflected by a mirror of mirror array 388, reflected by a mirror of mirror array 382, and coupled to a collimator of collimator array 380 to optical fiber 374, where it is received by receive optical signal block 376. The control wavelengths are at a different wavelength than the traffic optical signal. This facilitates the control beam being differentiated from the traffic beam. The control wavelength may be a shorter wavelength than the operational wavelength. For example, the control wavelength may be in the 800-850 nm or 950-1040 nm bandwidth range when traffic is in the 1550 nm telecommunications band or the 1300 telecommunications band. The optical power of the control beam may be chosen to suit the optical design, for example from about −15 dBm to about −20 dBm per control beam. The control wavelength may be the same wavelength in both directions. Alternatively, the control wavelength is a different wavelength in the two directions. The mirrors on both mirror arrays may be simultaneously and independently initially aligned, so that each mirror is illuminating the opposing mirror with control light.

The two optical control sources are injected from opposite sides of the system, and counter-propagate, each being used to control the positioning of the first mirror it encounters by allowing measuring of the position of its reflected beam in the vicinity of the second mirror it is targeted to encounter. An optical control source has light from one or more lasers. However, there does not need to be a dedicated laser per control channel, because the control power may be low relative to the laser's power output. One laser may drive multiple inputs using an optical splitter. Optical fibers 374 and 396 and the optical couplers 374 and 396 operate in a single mode at both the traffic wavelength and the control wavelength for the path from the couplers to the collimators.

A system with interstitial photodiodes may have an imprecise initial pointing, for example based on a simple approximate algorithm, without a history, large look-up table, or expensive and time consuming initial calibration. An algorithm may compute the initial pointing angle from one mirror of mirror array 388 to the opposing mirror of mirror array 382. An approximate drive voltage is derived from this angle and the average deflection/voltage characteristics of the mirror cell design. The voltage is then applied to the mirror. A voltage with the same magnitude and opposite sign angle is applied to the opposing mirror, because the two mirrors are deflected by the same magnitude but opposite sign for alignment. The control optical beam is reflected off of a mirror of mirror array 388, and forms a beam landing spot on mirror array 382. The beam landing spot is in the general vicinity of the target mirror, but probably not centered on the target mirror.

A mirror to mirror initial alignment may optimize the pointing of each of the two opposing mirrors in the path independently by measuring where the collimated light from their associated collimators falls on the opposing mirror array. The location is adjusted so the mirrors in the path illuminate the opposing mirror in that path with light from its associated collimator. For example, an optical signal enters a collimator of collimator array 394, is reflected off a mirror of mirror array 388, and falls on the opposing mirror of mirror array 382. Meanwhile, an optical signal enters a collimator of collimator array 380, is reflected off a mirror of mirror array 382, and falls on the opposing mirror of mirror array 388. Thus, a connection is established from collimator array 394 to a collimator of collimator array 380, and vice versa, by the principle of optical reciprocity. Light entering a collimator of collimator array 380 and reflected off of a mirror of mirror array 382 will, after accurate alignment of that mirror, be centered on the correct opposing mirror or mirror array 388. However, this does not constitute a connection to the required output collimator of collimator array 394, since the pointing of the illuminated mirror on mirror array 388 should also be aligned. However, at the same time, light entering a collimator of collimator array 394 and reflected off of a mirror of mirror array 388 will, after accurate alignment, be centered on the correct opposing mirror of mirror array 382. This means that once the two mirrors on the two arrays are accurately aligned the beam from collimator 380 is concentric with, and travelling in the opposite direction to, the beam from collimator 394. Hence, the beam from the collimator on collimator array 388 will back track the beam from the collimator on collimator array 394, and will exit the switch from collimator 394. In addition, the light from the appropriate collimator of collimator array 394 will back track the beam from the appropriate collimator of collimator array 380, and will emerge from the switch at that collimator. Hence, by optical beam reciprocity, the optical control beam from 380 will emerge from collimator 394, and vice versa, once the two control beams have optimized their respective controlled mirrors pointing. The traffic beam, being concentric to the control beam, will then be routed through the switch.

Figure 14:
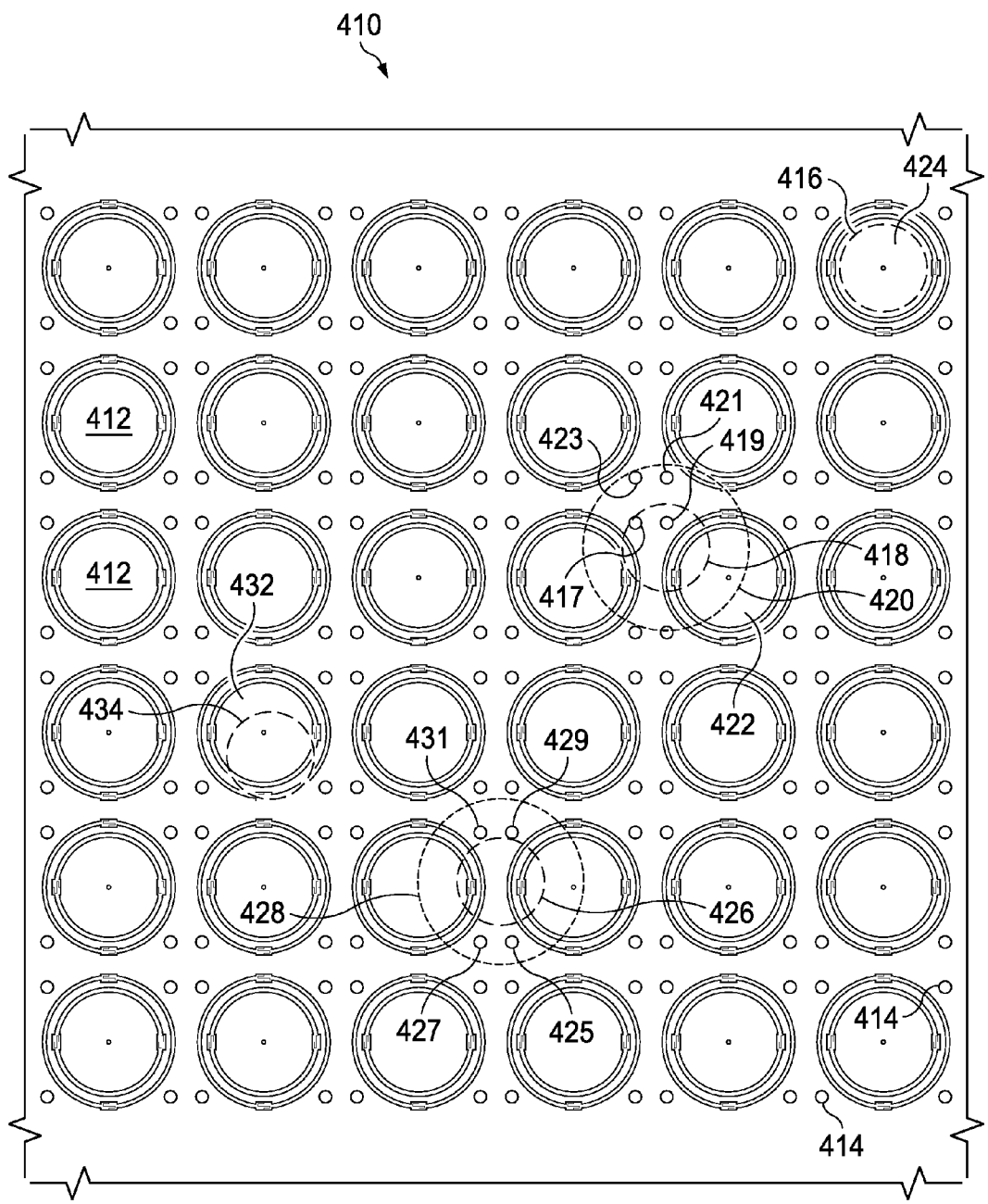
FIG. 14 illustrates optical beam spots on an embodiment MEMS mirror array with interstitial photodiodes.

FIG. 14 illustrates mirror array 410 with mirrors 412 and photodiodes 414 arranged between the mirrors. Several beam landing spots are shown on mirror array 410. Beam landing spot 416 is properly aligned on target mirror 424. Such precise alignment is unlikely after the initial alignment, but is the goal at the end of the alignment process.

Beam landing spot 418, aligned from a relatively accurate example of an initial calculation, partially illuminates target mirror 422. The position of beam landing spot 418 is detected by photodiodes 417 and 419. The highest intensity of light is detected by photodiode 419, which is the closest to the center of beam landing spot 418. In one example, this calculation is based on which photodiode receives the most light and vectoring a small step from that photodiode's location towards the center of the target mirror. A correction vector with a distance and angle from photodiode 419 at approximately the center of beam landing spot 418 on target mirror 422 is calculated. After applying this change by modifying the drive voltages, the location of the beam can be re-measured, and the process repeated if necessary.

In another example, this calculation determined by mapping the received power of all the illuminated photodiodes to a model of the power received as a function of distance from the center of the beam to determine the actual beam center location. The apparent size of beam landing spot 418 may be enlarged to beam landing spot 420 using dithering. With beam dithering, a low fixed level of two axis orbital positional modulation is applied to increase the apparent beam spot size. The modulation may be similar to that used during coarse precession. However, the amplitude is smaller, may be at a higher rate, and is fixed in amplitude, and the modulation is not measured directly. Specifically, no measurements of resultant signal modulation amplitude or phase are taken. When dithering is applied, photodiodes 417, 419, 421, and 423 are illuminated due to the increased apparent spot size. Then, based upon the average or peak powers received on each photodiode, the position of the center of the beam landing site can be calculated. From the position of the center of the beam landing spot, a direct vector, with an angle and distance is calculated using triangulation and applied from that location directly to the center of the target mirror. This approach may eliminate the need for fine optimization, although such optimization may be applied if needed. However, optimization maintenance cycling to protect against mirror drift may still be needed.

In another example, such as a situation resulting from a very approximate or wide tolerance initial calculation of initial pointing angles or drive voltages, beam landing spot 426 is located a few mirror pitches away from target mirror 432. The photodiodes where beam landing spot 426 landed respond to the control illumination. Initially, no photodiodes are illuminated. If dithering is performed, beam landing spot 426 is expanded to beam landing spot 428, and photodiodes 425, 427, 429, and 431 are illuminated. The detected illumination values may be used to calculate the center of the actual beam landing site. In one example, the location of the actual beam landing site is approximately determined based on which photodiode location receives the most light, for example photodiode 429. In another example, the beam landing site is accurately determined by beam power profile mapping the results from three or more photodiodes to determine the actual location of the center of the beam. For example, with dithering, photodiodes 429, 431, 425, and 427 may be used to triangulate the center of the landing beam. A correction vector based on these determinations is rapidly calculated. The mirror drive of the mirror on the opposing mirror array may then be adjusted. This brings the beam landing spot close to target mirror 432. For example, the beam may be moved to beam landing spot 434. If a detectable error remains, and some light is detected by the photodiodes around target mirror 432, a second small scale vector correction may be calculated. In mirror array 410, no photodiodes are illuminated at this stage around mirror 432 without dithering. In this case, keeping dithering on will identify that beam landing point 434 is not completely aligned with mirror 432. Hence, dithering should be kept on until equal powers of the dithered signal are received from all the photodiodes surrounding the target mirror. Then, dithering can be switched off, causing the photodiodes to become un-illuminated, requiring an alternative method for monitoring alignment during in-service operations. The set up and optimization measurements and calculation processes may occur rapidly, for example in microseconds. The slowest part of the correction is the physical movement of the mirrors, which may take a few milliseconds.

Beam dithering may always be applied during the initial mirror acquisition cycle. Alternatively, beam dithering is turned on only when the beam cannot be seen after the initial mirror deflection or the beam is impinging on fewer than three or four photodiodes. When the beam is not impinging on sufficient photodiodes, an approximate correction using data from one photodiode may be made. Then, the calculation is repeated for the new landing site, which is likely to illuminate multiple photodiodes. Instead of using beam dithering, when the initial beam alignment results in the illuminations of no photodiodes, the initial beam landing spot may be shifted by approximately half a mirror pitch in both x and y directions. This new beam landing spot is likely to illuminate some photodiodes.

During initial alignment, inadvertent illumination of other mirrors is not problematic, because the illumination is at a control wavelength that is only used during the initial alignment. If the mirrors are in service, inputs from their photodiodes will not be used to correct their pointing, and an alternative approach is used during this stage.

Figure 15:
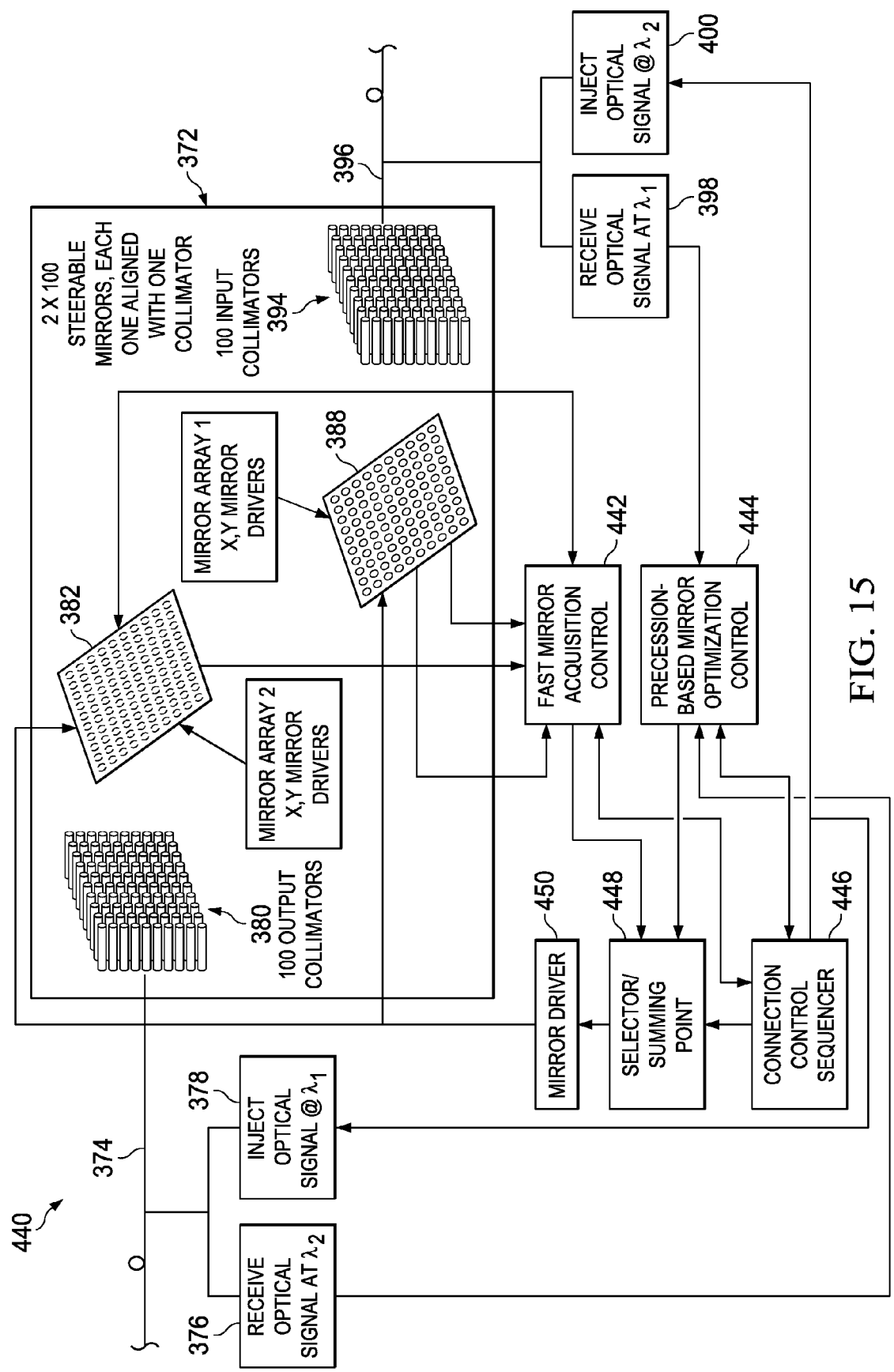
FIG. 15 illustrates an embodiment control system for aligning MEMS mirrors with interstitial photodiodes.

FIG. 15 illustrates control system 440 for aligning mirrors of MEMS photonic switch 372 with photodiodes on the mirror arrays. This control system includes two control systems—fast mirror acquisition control 442 for setting up the mirrors rapidly by using the arrays of photodiodes and a mirror acquisition control 444 connected to the output ports, which is used as needed for validating and optimizing the in-traffic or in-service signal. Mirror acquisition control 444 is used since, once the set up and alignment optimization is complete, the dithering is turned off, since it would interfere with the traffic signal. Hence, the photodiodes are unilluminated when the mirrors are in-service, and the photodiodes cannot be used to control the mirrors. Mirror acquisition control 444 can take many forms, such as a simplified form of the precession-based control as discussed above. The simplification is from the lack of need to initially find the connection, and the absence of need to set up rapidly based on precession. For this purpose, the in-service control system (receive optical signal block 376, receive optical signal block 398, and mirror acquisition 444) may perform fine precession, as discussed above. In other examples, a control system may use another form of fine optimization, or no fine optimization.

Following a set up, optimization and in-service monitoring process a connection request is initially received at connection control sequencer 446. The connection request is expressed in terms of an instruction to connect a specific input port to a specific output port. Connection control sequencer 446 determines which mirror, addressed by a row and column of mirror array 388, is associated with the appropriate input of collimator array 394 and which mirror, addressed by a row and column of mirror array 382 associated with the appropriate output of a collimator of collimator array 380 are to be aligned to create an optical path between a collimator of collimator array 380 and a collimator of collimator array 394. Then, based on the physical geometry, connection control sequencer 446 determines the appropriate beam angles from the selected mirror of mirror array 388 to the selected mirror of mirror array 382. The deflection angles are mapped to mirror drive voltages using the mirror deflection/voltage drive sensitivity data stored in memory. For example, a plot of deflection of the average mirror versus drive voltage is used. The drive voltages are then applied to the mirrors using mirror driver block 450.

Next, fast mirror acquisition control block 442 is activated. The optical power measurements from the photodiodes on mirror array 382 are received by fast mirror acquisition control block 442 from photodiodes in known positions on mirror array 382, and the beam landing spot of the control beam on mirror array 382 is determined. Also, the optical power measurements from the photodiodes on mirror array 388 are received, and the beam landing spot of the control beam on mirror array 388 is determined in the same manner. Fast mirror acquisition control block 442 examines the readings from photodiodes within a certain distance, the zone of uncertainty, from the target mirror. The zone of uncertainty is determined by the worst case errors possible for the computed initial drive voltages due to the tolerances within the system. When no or insufficient photodiode response is achieved, dithering may be activated to enlarge the apparent beam landing spot to illuminate some or more photodiodes in the zone of uncertainty. Alternatively, the beam landing location is shifted by half a mirror pitch in both x and y direction to make the beam landing spot visible to some photodiodes, because the geometry of the MEMS substrate is such that half a mirror pitch horizontally and vertically from the major photodiode-devoid area (the mirror and gimbal) is a photodiode-rich area (an interstitial area).

The photodiodes within the zone of uncertainty provide location and intensity information on the beam landing spot to fast mirror acquisition control block 442, which determines either the approximate or accurate center of the beam landing spot. An approximate center of the beam landing spot is determined from the location of the photodiode with the most received optical power, with an approximate correction vector from that photodiode location to the center of the target mirror. An accurate center of a beam landing spot is determined by mapping the locations and measured power of optical power measured by at least three photodiodes to a beam power density cross-sectional model and computing the distance of each photodiode from the center of the beam. An accurate correction vector is determined from that beam center location to the center of the target mirror.

Optionally, beam dithering is turned on if only one photodiode is illuminated so the beam illuminates multiple photodiodes. Then, the beam center can be triangulated, using average measured powers from at least three photodiodes and modeling the dithered beam as a defocused beam. This improves the precision of the calculation of the beam center, enabling precise vectoring to align the beam more accurately with the target mirror.

In another example, dithering is turned on for a short period once the beam has been centered on the target mirror. This will cause an equal average illumination of the photodiodes surrounding the target mirror if the beam is properly aligned. However, if the beam is not properly aligned, there will be a differing average power reading. The beam positioning is then adjusted to evenly illuminate the photodiodes. Dithering is then turned off. This process is more rapid than using fine precession. However, dithering should not be performed when the mirror is in service, because dithering impacts the traffic optical signal.

When fine precession is used for the in-service monitoring, mirror optimization control block 444 is used to periodically or continuously apply fine precession. In many situations, this block is only periodically applied, either on a fixed and relatively long time period (e.g. minutes-days) or in response to a detected loss of power due to mirror drift. Hence, one scan-able or switchable precession measuring system for the overall switch may be used. Selector/summing point block 448 is used to add the precession to the output of connection control sequencer 446 to drive mirror driver 450 to perform fine precession.

Figure 16:
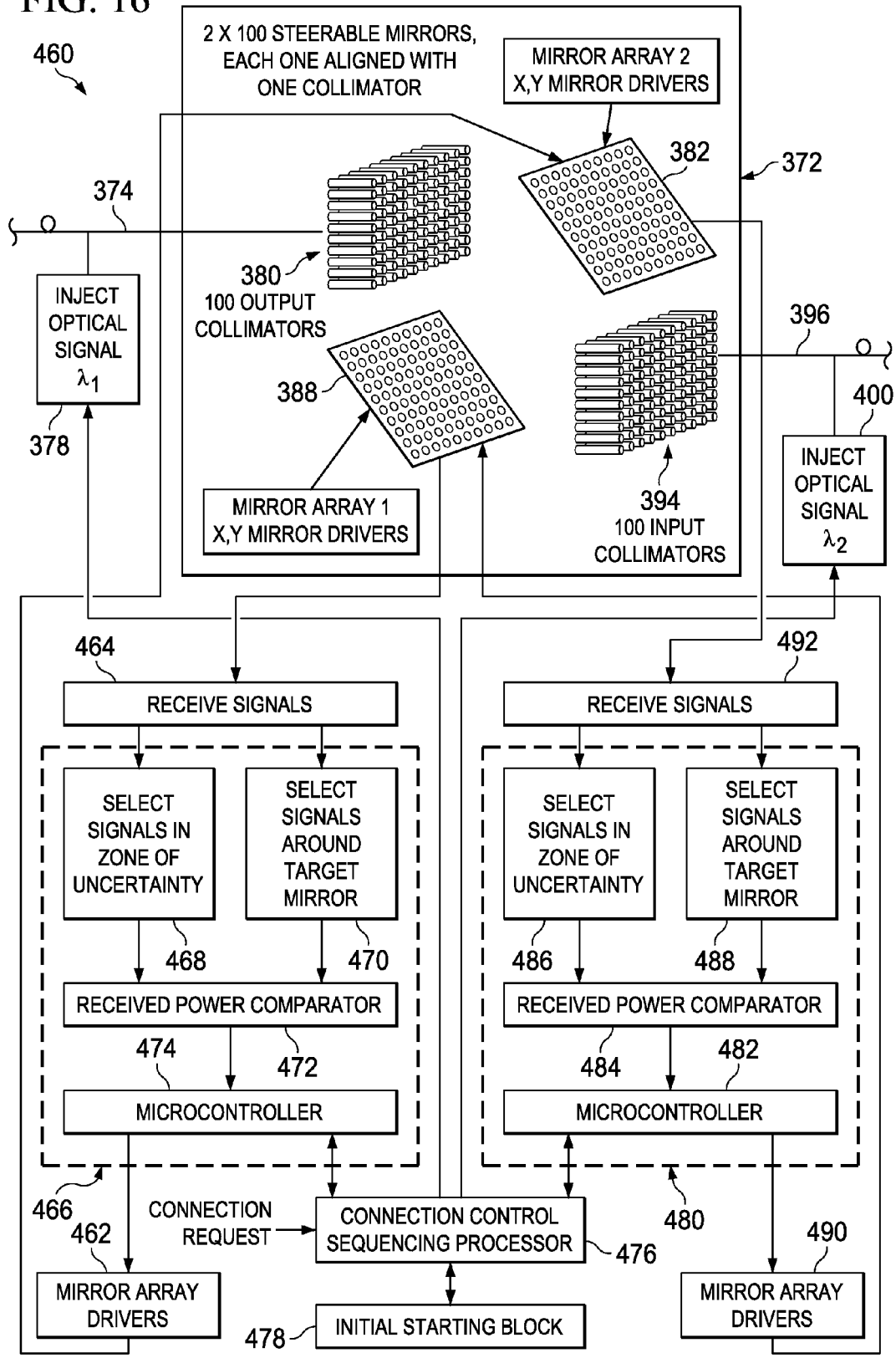
FIG. 16 illustrates another embodiment control system for aligning MEMS mirrors with interstitial photodiodes.

FIG. 16 illustrates a more detailed diagram of control system 460 for establishing optical paths by controlling the mirror alignment of MEMS photonic switch 372, which contains photodiodes. Initially, a connection request to connect an input port to an output port is received by connection control sequencing processor 476. Connection control sequencing processor 476 controls the overall process of setting up the connection. Upon receiving the connection request, connection control sequencing processor 476 determines which mirror, addressed by a row and column, is associated with the input port will be connected to which mirror, addressed by a row and column, associated with the output port in order to establish the desired optical path connection. This may be performed using the physical geometry of the MEMS photonic switch a simple look-up table, for example based upon row and column geometries to give x-angles and y-angles respectively.

In one example, the drive voltages are determined from the physical geometry of MEMS photonic switch 372 and a set of average mirror deflection sensitivity values. The average mirror deflection sensitivity values may be in the form of a deflection angle versus x and y drive voltages, and may be stored as in initial starting point block 478. Then, connection control sequencing processor 476 applies an algorithm or equation, which translates the mirror rows and columns into the pointing angle in the x and y planes to link the selected mirror of mirror array 388 with the opposing mirror of mirror array 382, in terms of deflection angles. The calculation determines a deflection angle in x to link a row in mirror array 388 to a row in mirror array 382 and a deflection angle y into link a column of mirror array 388 to a column in mirror array 382. The algorithm is based on the orientation of the mirror arrays, the spacing between the mirror arrays, the mirror pitch, and the number of mirrors in each row and column. After the calculation of the pointing angles, an average mirror drive voltage versus deflection angle characteristic, equation, or table of values is used to calculate the required initial drive voltage to point a typical mirror in the appropriate direction so the beam of light from the corresponding input collimator lands on or near the target mirror of the opposing mirror array. This will result in an approximate pointing, because it is based on a set of average values, and the actual mirrors have tolerances that limit the accuracy of this initial calculation. When the drive voltages are applied, the mirrors will point approximately such that they illuminate each other. The range of pointing error is determined by the tolerances in the mirror design and the approximations used in the algorithms. Thus, there is a zone of uncertainty around the target mirror where the initial beam landing spot may fall.

In another example, a simple look-up table of drive voltages to link rows of a mirror array to rows of the opposing mirror array and columns of one mirror array to columns of the opposing mirror array is based on average device behavior is used. The entries of this look-up table are based on the algorithms discussed above, stored in a tabular form.

The initial settings for the drive voltages are passed to microcontroller 474 of mirror control 466 to control mirror array 388 and microcontroller 482 of mirror controller 480 to control mirror array 382. There may be one microcontroller per mirror, one microcontroller for multiple mirrors, one microcontroller per row or column, or one microcontroller per mirror array, depending on the processing power of the microcontroller and the performance requirements and array size of the MEMS switch. Alternatively, the microcontrollers may be a software function within connection control sequencing processor 476. The microcontroller responsible for steering the selected mirror of mirror array 388 sets the initial drive voltages to cause the forward propagating control beam from source 400 to fall on mirror array 382, while the microcontroller responsible for steering the selected mirror of mirror array 382 sets the drive voltages to cause the backward propagating control beam from source 378 to fall on mirror array 388. The beams fall within the zone of uncertainty around the target mirror on the opposing mirror array.

While the initial drive voltages are applied, the other mirrors in the zone of uncertainty are locked at their current positions by locking their drive voltages at their current settings for the few milliseconds period of setting up the initial path of the new connection and acquiring the correct mirror. Hence, their alignment is unaffected by the optical power received by nearby photodiodes. These other mirrors may be in service. The photodiode responses are received by receive signals block 464 from mirror array 388 and receive signals block 492 from mirror array 382. The signals within the zones of uncertainty are selected by select signals in zone of uncertainty blocks 468 and 486, which select and lock mirrors within the zone of uncertainty around the mirror targeted for set up, freeing the photodiodes of these mirrors for use as beam landing detectors.

The selected signals are conveyed to received power comparators 472 and 484, which may be hardware blocks, processing blocks, or software routines in microcontrollers 474 and 482. Received power comparators 472 and 484 analyze the responses from the photodiodes in the zones of uncertainty. Then, in one example, the approximate landing sites are determined by examining the photodiode responses and finding the photodiode with the largest response, which is from the photodiode closest to the center of the beam landing spot. The distance from the photodiode to the center of the beam landing spot is only approximately known, and the direction is unknown. The beam is moved towards the target mirror by an amount based on the difference between the physical coordinates of the most responsive photodiode and the physical coordinates of the target mirror. A correction distance and angle is computed based on the vector distance from the most responsive photodiode physical position to the target mirror physical position. This will leave a known error—the unmeasured distance from the beam center to the most responsive photodiode, so this process will be iteratively repeated until alignment is well achieved.

In another example, the initial beam landing site is detected by taking the responses of at least three of the most responsive photodiodes. From their power responses, the center of the beam from each photodiode can be calculated, allowing a triangulation of the beam center relative to the photodiode positions. This can be done with a minimum of three illuminated photodiodes when the beam power and the power density distribution across the beam diameter is known, or with four photodiodes when just the beam power density distribution across the beam diameter is known. The beam power intensity as a function of offset from the center of the control beam may be used in the triangulation. For a Gaussian beam, this is known. Circles of distance may be created from each photodiode to the center of the beam. When these are overlaid, the intersection of the circles is the center of the beam. This is especially accurate when the power from four or more photodiodes is used. An accurate vector based on the location of the center of the beam, rather than the location of the most responsive photodiode, may be calculated to place the beam accurately on the target mirror.

The calculated correction voltages are then applied using mirror array drivers 462 and 490.

Because the photodiodes are unevenly placed across the mirror arrays, the initial beam may fall in an area within the zone of uncertainty where there are no photodiodes. In this case, no response is detected by photodiodes within the zone of uncertainty. For example, there are no photodiodes on the mirrors or gimbals. In one example, the location of the beam may be found by dithering, causing the beam to walk in an orbit by modulating the opposing mirror's drive voltages with a sine wave and cosine wave signal with a fixed amplitude. This causes the beam spot size to apparently increase by the orbiting diameter, for example by a fraction of a millimeter. In another example, the beam is moved by approximately half a mirror pitch in both x and y directions. With many mirror array designs, this will result in the beam being moved from landing on a mirror which may not be the correct mirror and/or its gimbals to a point incident on a high density of photodiodes. The beam correction vector can then be calculated from the new landing site.

When microcontrollers 474 or 482 determine that the beam is substantially overlapping the target mirror, beam dithering is turned on if it is not already on. The responses from the photodiodes surrounding the target are examined. The signals are received by receive signals block 464 or 492, and selected by select signals from around target mirror block 470 or 488. Then, the signal is received by received power comparator 484 or 472.

From the relative responses, the beam power center position may be computed, and a correction vector may be computed and applied. This may be done by light being detected by three, four, or more photodiodes, and the center of the beam is accurately found. Alternatively, the beam is nudged a small amount towards one or more photodiodes with the lowest response in an iterative cycle of movement and measurement, until the responses from the photodiodes are all approximately the same. At that point, the beam is centered on the mirror, and beam dithering is turned off, and the mirror link is put into service.

After the beam dithering is turned off, the photodiodes surrounding the target mirrors are no longer illuminated, and the mirror drift is not detectable by these photodiodes. However continuous, regular or periodic application of a parallel low level of precession combined with output port monitoring may be applied to maintain alignment, for instance in the event that a power or loss measurement indicates a mirror drift.

Figure 17:
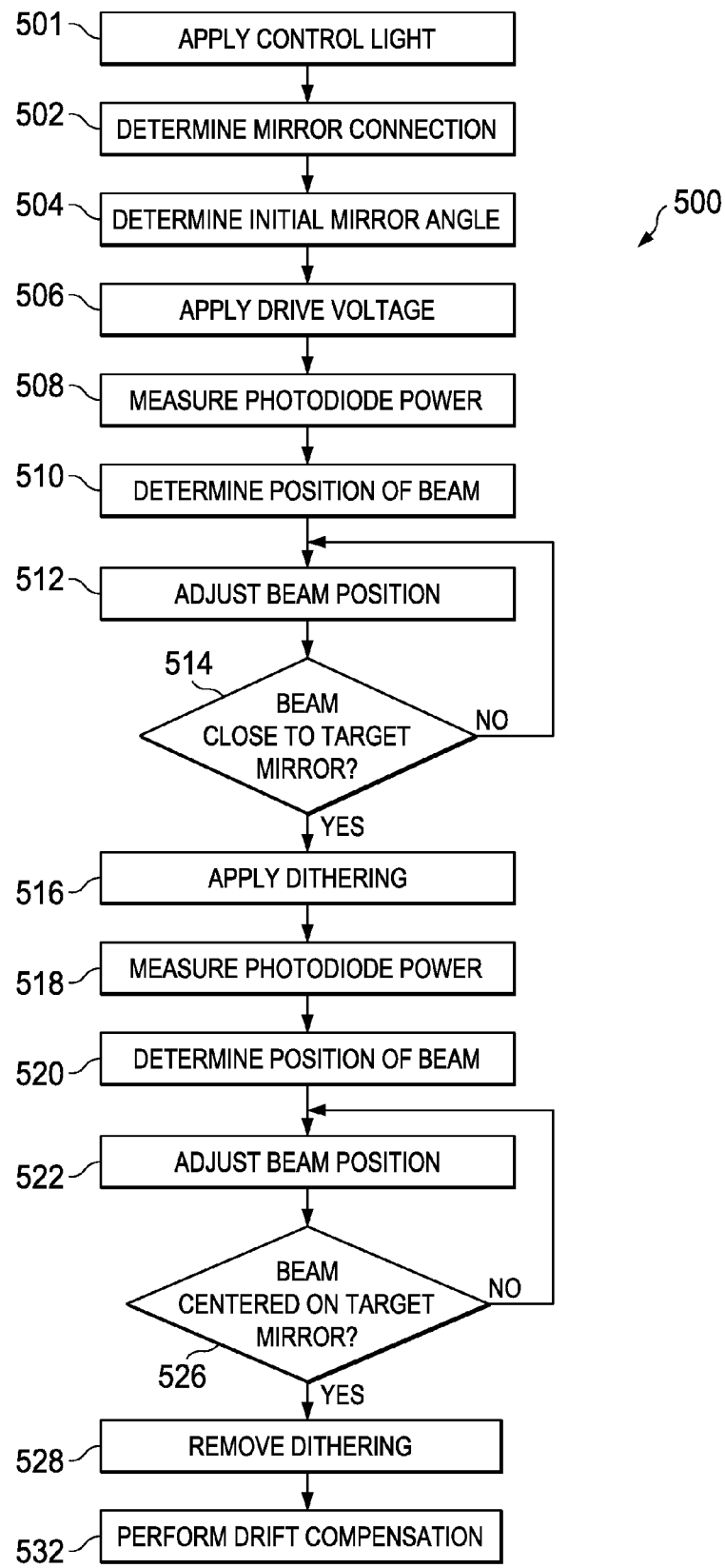
FIG. 17 illustrates a flowchart of an embodiment method of aligning MEMS mirrors with interstitial photodiodes.

FIG. 17 illustrates flowchart 500 for a method of aligning mirrors in a MEMS photonic switch with photodiodes on the mirror arrays. Flowchart 500 demonstrates a method for aligning a single mirror of a mirror pair on opposing mirror arrays. However, the illustrated method may be performed simultaneously on opposing mirrors to be aligned. Initially, in step 501, a control optical signal is applied. The wavelength of the control optical signal is different than the wavelength of the traffic optical signal, so the wavelengths may be distinguished.

In step 502, a connection between opposing mirrors on opposing mirror arrays is determined. The mirror connection completes a path from the input collimator to the mirror on a mirror array, to mirror on the opposing mirror array, to an output collimator. Once a connection is aligned, it is available for traffic propagation in both directions.

Then, in step 504, the initial mirror angle is determined. In one example, the initial angle is computed based on the geometry of the mirror arrays. In another example, the initial angle is based on values in a simple a look-up table. For example, the look-up table is based on calculations based on the rows and columns of the mirrors.

Next, in step 506, a drive voltage is applied to initially align the mirror. The drive voltage is based on the mirror angle.

In step 508, the optical power received by photodiodes is measured. Photodiodes within a zone of uncertainty of the target mirror are measured. The zone of uncertainty is determined based on the maximum error in the initial alignment.

The position of the beam landing spot is determined in step 510. In one example, the optical power of the beam is most strongly detected by one illuminated photodiode. The beam position may be approximately determined to be at that photodiode. In another example, three or four photodiodes are illuminated by the control beam. The center of the beam may then be determined by triangulation. The control beam might not be detected by any photodiodes, for example when the beam falls entirely on a (probably incorrect) mirror. When the beam is not detected by any photodiodes, or is not detected by sufficient photodiodes, it may be adjusted by half the mirror pitch in both the x and y directions. This is likely to make the beam visible to some photodiodes. Alternatively, the effective sot size of the beam landing spot is expanded by applying dithering. Dithering may also be initially applied. This option is not shown in FIG. 17, but may be applied between step 506 and or 508, or after step 508, when step 508 provides no output, followed by a repeat of step 508.

Next, in step 512, the beam landing spot is adjusted, for example by using a vector from the determined center of the beam landing spot to the center of the target mirror. The drive voltage is adjusted to move the beam by this vector. Additionally, dithering may be applied to the beam to expand its apparent beam landing spot size. Dithering may be performed when the beam is not detected by any photodiodes, all the time, or when the beam is detected by fewer than three or four photodiodes.

Then, in step 514, the beam position is again determined by measuring the received optical signal of photodiodes within the zone of uncertainty. When the beam is not sufficiently close to the target mirror, for example when only one photodiode or no photodiodes were previously illuminated, the beam position is again adjusted in step 512. When the beam is sufficiently close to the target position, the system proceeds to step 516.

In step 516, the beam is dithered. The position of the beam is varied by a constant amplitude to effectively increase the beam landing spot size.

The optical power is measured by photodiodes near the target mirror in step 518.

Next, in step 520, the position of the beam landing spot is determined. The position of the beam landing spot may be approximately determined when one photodiode is illuminated, accurately determined when three or four photodiodes are illuminated, and triangulation is performed.

In step 522, the beam position is adjusted based on the beam position determined in step 520. A vector is calculated from the center of the beam landing spot to the center of the target mirror, and the beam is adjusted by that amount.

Then, in step 526, it is determined whether the beam position is sufficiently aligned to the target mirror. When the beam is not sufficiently aligned to the target mirror, the beam position is again adjusted in step 522. When the beam is sufficiently aligned, the system proceeds to step 528.

Dithering is removed in step 528. The mirror connection is then put into service.

While the mirror connection is in service, drift compensation is performed in step 532. Drift compensation may be performed periodically, or when a potential misalignment is detected. Drift compensation may use fine precession, as discussed above.

Because the photodiodes are illuminated only during the alignment process, a mirror connection may be aligned while other mirror connections are in service. However if two nearby mirror pairs are being aligned simultaneously, there is a possibility that one of the control beams temporarily disrupting the other. This can be avoided by only aligning one mirror within the zone of uncertainty at a time.

Aligning MEMS mirror pairs using fine precession and/or coarse precession takes several tens of milliseconds for alignment. The time is affected by many factors, such as mirror mass, gimbal torsion spring strength, the resonant frequency, the damping factor of the resonance, the size of the zone of uncertainty, the maximum usable precession frequency, and the pass-band bandwidth of the filtering for that frequency. Table 1, below, illustrates an example of the time for aligning mirrors using fine precession and coarse precession for an array of MEMS mirrors with a specific set of mirror mechanical properties, including mirror mass-torsion spring resonant frequencies.

TABLE 1

| Action | Time |
|---|---|
| Interpret set up request, determine mirror pairing, access look-up table, and determine initial voltage values | <50 μs |
| Ramp voltage to mirrors to avoid overshoot | 1.5 ms |
| Determine if initial optical path is connected | <50 μs |
| Apply coarse precession at 1 kHz and 800 Hz | 37.5 ms |
| Measure phase and amplitude of precession envelope, compute and apply correction | 16.5 ms |
| Determine whether optical path is corrected after coarse precession | <50 μs |
| Apply fine precession at 1 kHz to one mirror | 15 ms |
| Apply correction to mirror and ramp signal | 1.5 ms |
| Apply fine precession at 800 kHz to one mirror | 15 ms |
| Apply correction to mirror and ramp signal | 1.5 ms |
| Set up time without coarse precession | 34.6 ms |
| Set up time with coarse precession | 88.65 ms |

Table 2 below illustrates an example of the time for aligning mirrors using interstitial photodiodes using an array of MEMS mirrors with the same specific set of mirror mechanical properties used in Table 1. The set up time without dithering is 6.2 ms, and the set up time with dithering is 10.8 ms. The mirrors can be dithered much faster than they can be precessed, because as the speed of rotational offset increases, the angular uncertainty of the fidelity of the mirror movement increases. In effect, the mirror angle lags behind the drive voltage by an increasingly unknown amount as the frequency increases, which is of importance in precession measurements but not in dithering. In dithering, no angular or timing measurements are made, so the signal can be applied at higher speeds where the angular lag of the mirrors is uncertain. Aligning the mirrors using photodiodes may be about eight times faster than aligning using coarse and fine precession.

TABLE 2

| Action | Time |
|---|---|
| Interpret set up request, determine mirror pairing, access look-up table, and determine initial voltage values | <100 μs |
| Ramp voltage to mirrors to avoid overshoot | 1.5 ms |
| Determine whether initial optical path is connected | <50 μs |
| Apply dithering at 2 kHz | 3 ms |
| Collect photodiode response | <50 μs |

TABLE 2-continued

| Action | Time |
| --- | --- |
| Determine and apply correction vector | <50 µs |
| Ramp voltage to mirrors to avoid overshoot | 1.5 ms |
| Determine if initial optical path is present | <50 µs |
| Apply dithering to both mirrors, measure average power on photodiodes surrounding target mirrors | 3 ms |
| Compute corrective angle and phase | <50 µs |
| Apply correction to mirrors and ramp signal | 1.5 ms |
| Set up time without acquisition dithering | 6.2 ms |
| Set up time with acquisition dithering | 10.8 ms |

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A micro-electro-mechanical-system (MEMS) photonic switch comprising:
    a first plurality of collimators;
    a first mirror array optically coupled to the first plurality of collimators, wherein the first mirror array comprises:
        a first plurality of first MEMS mirrors integrated on a first substrate, and
        a first plurality of first photodiodes integrated on the first substrate, wherein the first plurality of first photodiodes are disposed in interstitial spaces between the first plurality of first MEMS mirrors,
        a plurality of photodiode lines, wherein a number of the plurality of photodiode lines is fewer than a number of the first plurality of first photodiodes; and
    a second mirror array optically coupled to the first mirror array, wherein the second mirror array comprises:
        a second plurality of second MEMS mirrors integrated on a second substrate, and
        a second plurality of second photodiodes integrated on the second substrate,
wherein the second plurality of second photodiodes are disposed in interstitial spaces between the second plurality of second MEMS mirrors, wherein a first collimator of the first plurality of collimators is disposed to direct a light beam to a first mirror of the first plurality of first MEMS mirrors, wherein the first mirror is configured to direct the light beam to the second substrate, wherein the light beam is destined for a first target mirror of the second plurality of second MEMS mirrors, wherein a first photodiode of the second plurality of second photodiodes is configured to detect the light beam, and wherein the first photodiode is associated with a second target mirror of the second plurality of second MEMS mirrors.

2. The MEMS photonic switch of claim 1, further comprising:
    a second plurality of collimators optically coupled to the second mirror array.

3. The MEMS photonic switch of claim 2, wherein the first plurality of first photodiodes is configured to produce a first plurality of signals to control a direction of a third target mirror of the second plurality of second MEMS mirrors.

4. The MEMS photonic switch of claim 3, wherein the second plurality of second photodiodes is configured to produce a second plurality of signals to control a direction of the first target mirror.

5. The MEMS photonic switch of claim 4, wherein a first collimator of the first plurality of collimators is configured to receive a first optical beam, wherein the third target mirror is configured to reflect the first optical beam, wherein a second collimator of the second plurality of collimators is configured to receive a second optical beam, and wherein the first target mirror is configured to reflect the second optical beam.

6. The MEMS photonic switch of claim 5, wherein the second target mirror is configured to cyclically dither the first optical beam to enlarge an apparent beam spot size of a beam spot on the first mirror array.

7. The MEMS photonic switch of claim 5, wherein the first plurality of collimators is configured to be coupled to a first plurality of optical fibers, and wherein the second plurality of collimators is configured to be coupled to a second plurality of optical fibers, wherein optical fibers of the first plurality of optical fibers are single mode fibers at a control wavelength and at a traffic wavelength.

8. The MEMS photonic switch of claim 5, wherein photodiodes of the first plurality of first photodiodes within a zone of uncertainty of the second target mirror are configured to detect the second optical beam.

9. The MEMS photonic switch of claim 8, wherein mirrors other than the second target mirror within the zone of uncertainty of the second target mirror are configured to be locked.

10. The MEMS photonic switch of claim 2, wherein the first plurality of first photodiodes is configured to detect a first control optical signal at a control wavelength and not a first traffic optical signal at a traffic wavelength, and wherein the second plurality of second photodiodes is configured to detect a second control optical signal at the control wavelength and not a second traffic optical signal at the traffic wavelength.

11. The MEMS photonic switch of claim 10, wherein the MEMS photonic switch is configured to coaxially project the first control optical signal and the first traffic optical signal, and wherein the MEMS photonic switch is configured to coaxially project the second control optical signal and the second traffic optical signal.

12. The MEMS photonic switch of claim 1, wherein the first plurality of first photodiodes is configured to detect a control optical signal at a control wavelength and not a traffic optical signal at a traffic wavelength.

13. The MEMS photonic switch of claim 12, wherein the MEMS photonic switch is configured to coaxially project the control optical signal and the traffic optical signal.

14. A method of aligning a first mirror and a second mirror of a micro-electro-mechanical system (MEMS) photonic switch, the method comprising:
    receiving, by a first collimator of a first plurality of collimators, a first optical control signal;

reflecting, by the first mirror on a first mirror array, the first optical control signal to produce a first optical control beam;

locking a plurality of mirrors within a zone of uncertainty of the second mirror on a second mirror array; and detecting, by a first photodiode having a first location on the second mirror array, a first beam spot of the first optical control beam to produce a first detected optical signal, wherein the second mirror array comprises the second mirror, wherein the first optical control beam is destined for the second mirror, and wherein the first photodiode is disposed at least one mirror pitch away from the second mirror.

15. The method of claim 14, further comprising adjusting an angle of the first mirror, comprising:
determining a vector from the first location of the first photodiode to a center of the second mirror in accordance with the first detected signal; and
adjusting a center of the first beam spot by the vector.

16. The method of claim 14, further comprising:
detecting, by a second photodiode having a second location on the second mirror array, the first beam spot to produce a second detected signal;
detecting, by a third photodiode having a third location on the second mirror array, the first beam spot to produce a third detected signal;
determining a center of the first beam spot in accordance with the first location, the first detected signal, the second location, the second detected signal, the third location, and the third detected signal;
determining a vector from the center of the first beam spot to a center of the second mirror; and
adjusting an angle of the first mirror comprising adjusting the center of the first beam spot by the vector.

17. The method of claim 14, wherein a plurality of mirrors of the second mirror array have an x axis pitch and a y axis pitch, the method further comprising adjusting a center of the first beam spot by half of the x axis pitch.

18. The method of claim 17, the method further comprising adjusting the center of the first beam spot by half of the y axis pitch.

19. The method of claim 14, further comprising finely orbiting the first mirror.

20. The method of claim 14, further comprising:
receiving, by a second collimator of a second plurality of collimators, a second optical control signal;
reflecting, by the second mirror, the second optical control signal to produce a second optical control beam;
detecting, by a second photodiode of the first mirror array, a second beam spot of the second optical control beam to produce a second detected signal;
adjusting an angle of the first mirror; and
adjusting an angle of the second mirror.

21. The method of claim 14, further comprising cyclically dithering the first mirror to apparently enlarge a size of the first beam spot.

22. The method of claim 14, further comprising detecting signals only from a portion of photodiodes on the second mirror array, wherein the portion of photodiodes comprise the first photodiode, and wherein the portion of photodiodes includes all photodiodes within the zone of uncertainty.

23. A control system comprising:
a mirror acquisition control unit configured to be coupled to a micro-electro-mechanical-system (MEMS) photonic switch, wherein the mirror acquisition control unit is configured to receive a first plurality of signals from a first plurality of interstitial photodiodes having a first plurality of locations on a first MEMS mirror array of the MEMS photonic switch;
a mirror driver coupled to the mirror acquisition control unit, wherein the mirror driver is configured to be coupled to the MEMS photonic switch, and wherein the mirror driver is configured to control a first mirror of a second MEMS mirror array of the MEMS photonic switch in accordance with the first plurality of signals and the first plurality of locations; and
a first inject optical signal module configured to inject a first control optical signal into a first collimator of a first plurality of collimators of the MEMS photonic switch to reflect off the first mirror to form a first beam spot on the first MEMS mirror array, and wherein the mirror driver is further configured to cyclically dither the first mirror to enlarge an apparent size the first beam spot.

24. The control system of claim 23, wherein the mirror driver is further configured to equalize a second plurality of signals of the first plurality of signals, wherein the second plurality of signals is from a subset of interstitial photodiodes of the first plurality of interstitial photodiodes, and wherein the subset of interstitial photodiodes surround a second mirror of the first MEMS mirror array.

25. The control system of claim 23, further comprising:
a receive optical signal module configured to be coupled to a second collimator of a second collimator array of the MEMS photonic switch; and
a mirror optimization unit coupled to the receive optical signal module and the first inject optical signal module, wherein the mirror optimization unit is configured to monitor the first mirror for drift, and wherein the mirror optimization unit is further configured to perform fine precession on the first mirror.

26. The control system of claim 25, wherein the mirror optimization unit is configured to perform fine precession on the first mirror periodically.

27. The control system of claim 25, wherein the mirror optimization unit is configured to perform fine precession in accordance with a change in optical power detected by the receive optical signal module.

28. The control system of claim 23, wherein the mirror acquisition control unit is further configured to receive a second plurality of signals from a second plurality of interstitial photodiodes having a second plurality of locations on the second MEMS mirror array, wherein the mirror driver is further configured to control a second mirror on the first MEMS mirror array in accordance with the second plurality of signals and the second plurality of locations, and wherein the control system further comprises a second inject optical signal module configured to inject a second control optical carrier into a second collimator of a second plurality of collimators of the MEMS photonic switch to the second mirror.

29. The control system of claim 23, wherein the mirror driver is further configured to initially position the first mirror in accordance with a second plurality of locations of a first plurality of mirrors of the first MEMS mirror array and a third plurality of locations of a second plurality of mirrors of the second MEMS mirror array.

30. The control system of claim 23, wherein the mirror driver is further configured to adjust a center of the first beam spot by half of an x axis pitch of the first MEMS mirror array and by half of a y axis pitch of the first MEMS mirror array.

* * * * *